(12) United States Patent
Shafer et al.

(10) Patent No.: US 6,512,631 B2
(45) Date of Patent: Jan. 28, 2003

(54) BROAD-BAND DEEP ULTRAVIOLET/ VACUUM ULTRAVIOLET CATADIOPTRIC IMAGING SYSTEM

(75) Inventors: David R. Shafer, Fairfield, CT (US); Yung-Ho Chuang, Cupertino, CA (US); J. Joseph Armstrong, Milipitas, CA (US)

(73) Assignee: KLA-Tencor Corporation, San Jose, CA (US)

( * ) Notice: Subject to any disclaimer, the term of this patent is extended or adjusted under 35 U.S.C. 154(b) by 0 days.

(21) Appl. No.: 09/349,036

(22) Filed: Jul. 7, 1999

(65) Prior Publication Data

US 2001/0040722 A1 Nov. 15, 2001

Related U.S. Application Data

(63) Continuation-in-part of application No. 09/046,814, filed on Mar. 24, 1998, now Pat. No. 6,064,517, which is a continuation-in-part of application No. 08/908,247, filed on Aug. 7, 1997, now Pat. No. 5,999,310, which is a continuation-in-part of application No. 08/681,528, filed on Jul. 22, 1996, now Pat. No. 5,717,518.

(51) Int. Cl.[7] ............................................. G02B 13/14
(52) U.S. Cl. ..................... 359/355; 359/364; 359/365; 359/366; 359/385
(58) Field of Search ................................. 359/355, 364, 359/365, 366, 385, 389, 727–732

(56) References Cited

U.S. PATENT DOCUMENTS

| | | | |
|---|---|---|---|
| 3,237,515 A | | 3/1966 | Altman |
| 4,779,966 A | * | 10/1988 | Friedman .................... 359/355 |
| 4,795,244 A | * | 1/1989 | Uehara et al. ............... 356/401 |
| 5,089,913 A | * | 2/1992 | Singh et al. ................. 359/727 |
| 5,140,459 A | | 8/1992 | Sagan |
| 5,323,263 A | * | 6/1994 | Schoenmakers ............ 359/366 |
| 5,515,207 A | * | 5/1996 | Foo ............................. 359/731 |
| 5,636,066 A | | 6/1997 | Takahashi |
| 5,668,673 A | * | 9/1997 | Suenaga et al. ............ 359/366 |
| 5,717,518 A | | 2/1998 | Shafer et al. |
| 5,805,334 A | * | 9/1998 | Takahashi ................... 359/364 |
| 5,805,357 A | * | 9/1998 | Omura ........................ 359/727 |
| 5,808,805 A | * | 9/1998 | Takahashi ................... 359/651 |
| 5,835,275 A | * | 11/1998 | Takahashi et al. .......... 359/727 |
| 5,861,997 A | * | 1/1999 | Takahashi ................... 359/727 |

FOREIGN PATENT DOCUMENTS

| | | |
|---|---|---|
| DE | 108181 | 1/1900 |
| EP | 0798585 | 10/1997 |
| GB | 2269024 | 1/1994 |
| WO | WO 9908134 | 2/1999 |

* cited by examiner

Primary Examiner—Mohammad Sikder
(74) Attorney, Agent, or Firm—Smyrski & Livesay, LLP

(57) ABSTRACT

A design for inspecting specimens, such as photomasks, for unwanted particles and features such as pattern defects is provided. The system provides no central obscuration, an external pupil for aperturing and Fourier filtering, and relatively relaxed manufacturing tolerances, and is suited for both broad-band bright-field and laser dark field imaging and inspection at wavelengths below 365 nm. In many instances, the lenses used may be fashioned or fabricated using a single material. Multiple embodiments of the objective lensing arrangement are disclosed, all including at least one small fold mirror and a Mangin mirror. The system is implemented off axis such that the returning second image is displaced laterally from the first image so that the lateral separation permits optical receipt and manipulation of each image separately. The objective designs presented have the optical axis of the Mangin mirror image relay at ninety degrees to the optical axis defined by the focusing lenses, or an in-line or straight objective having one ninety degree bend of light rays.

13 Claims, 9 Drawing Sheets

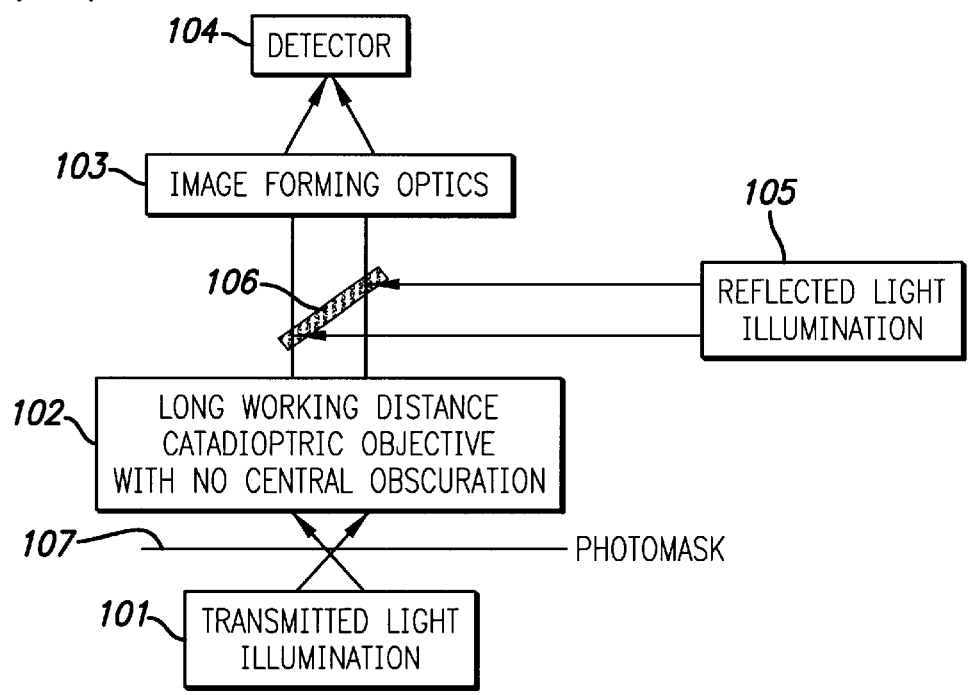
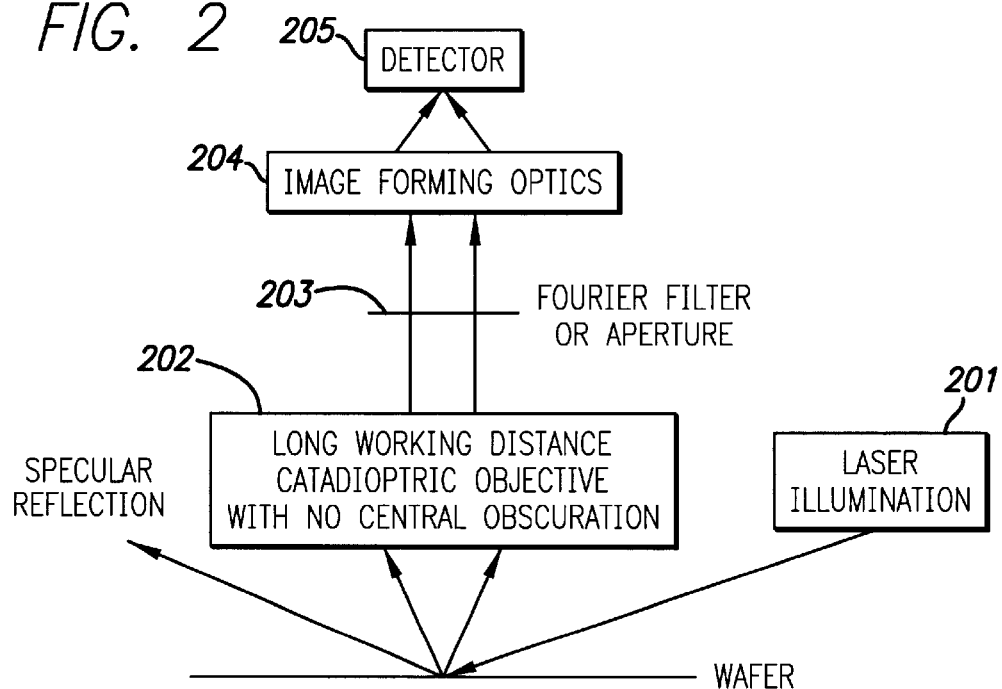

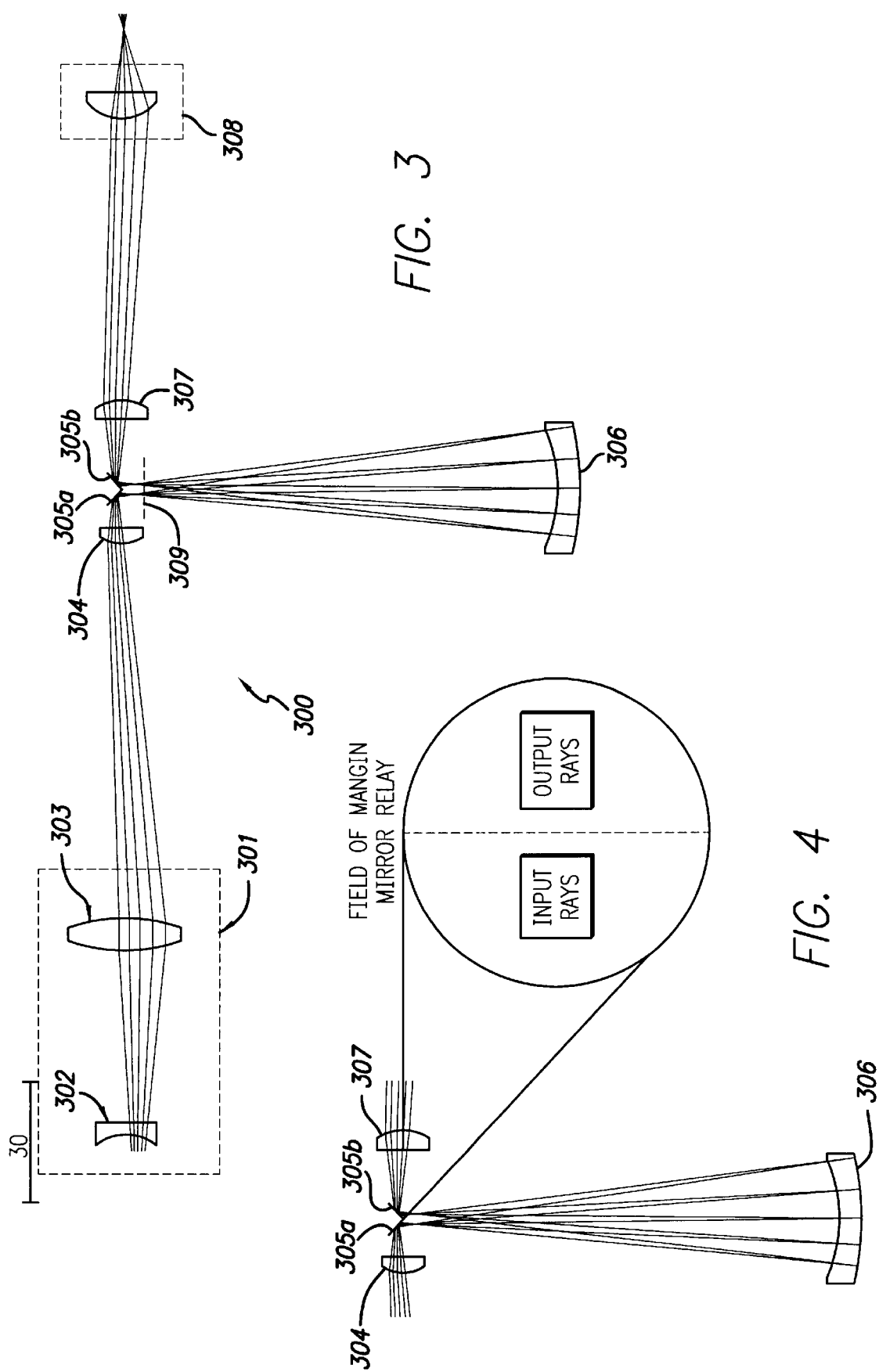

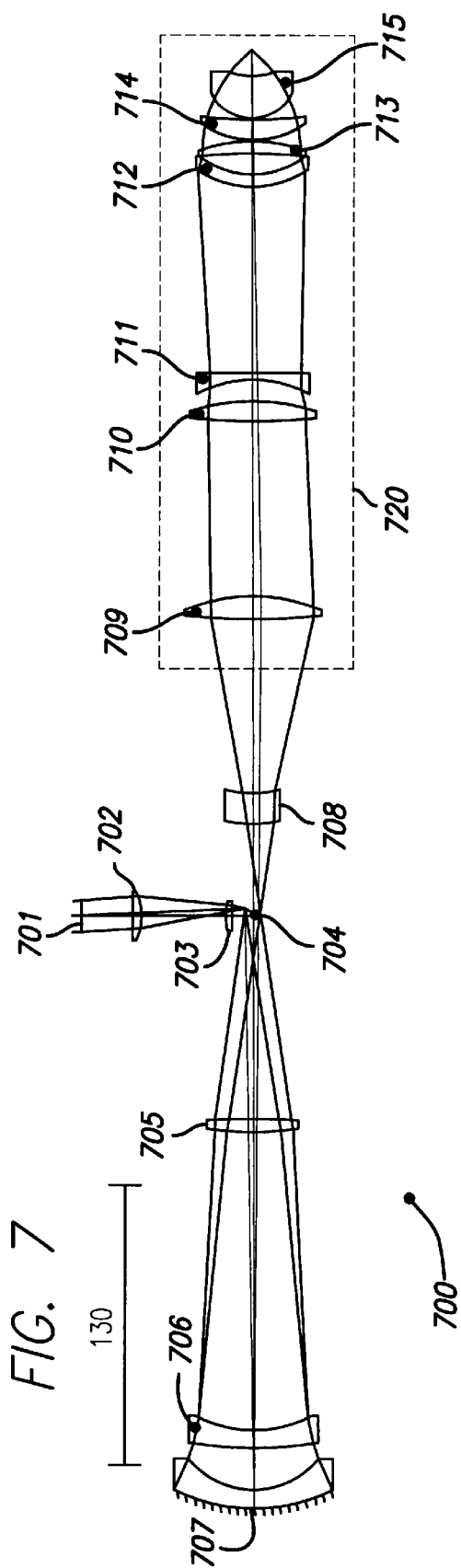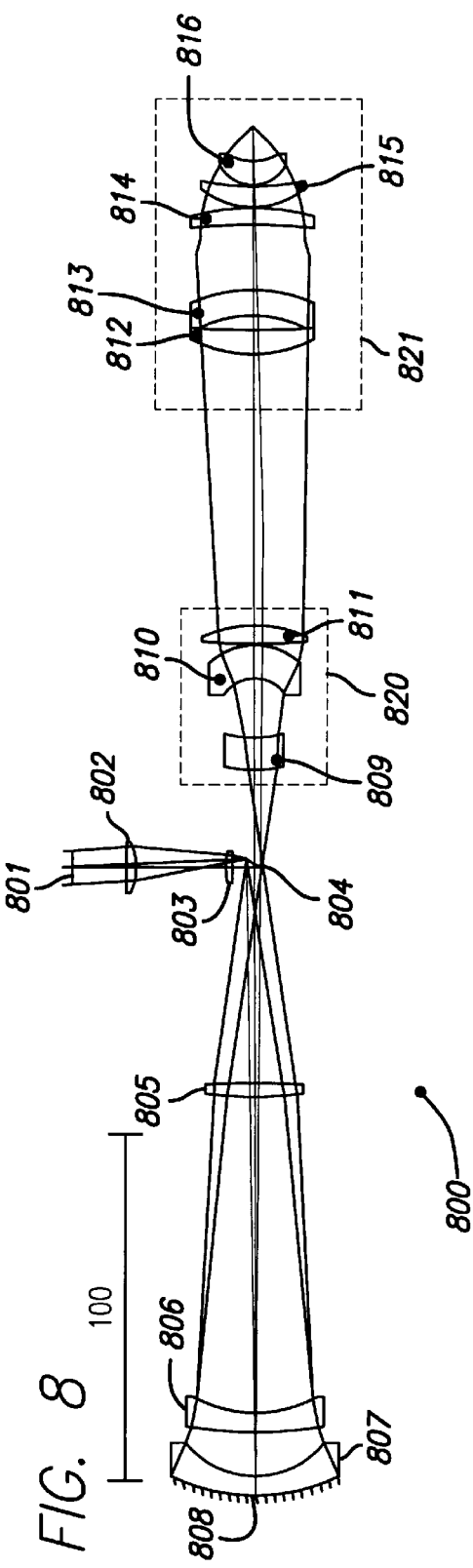

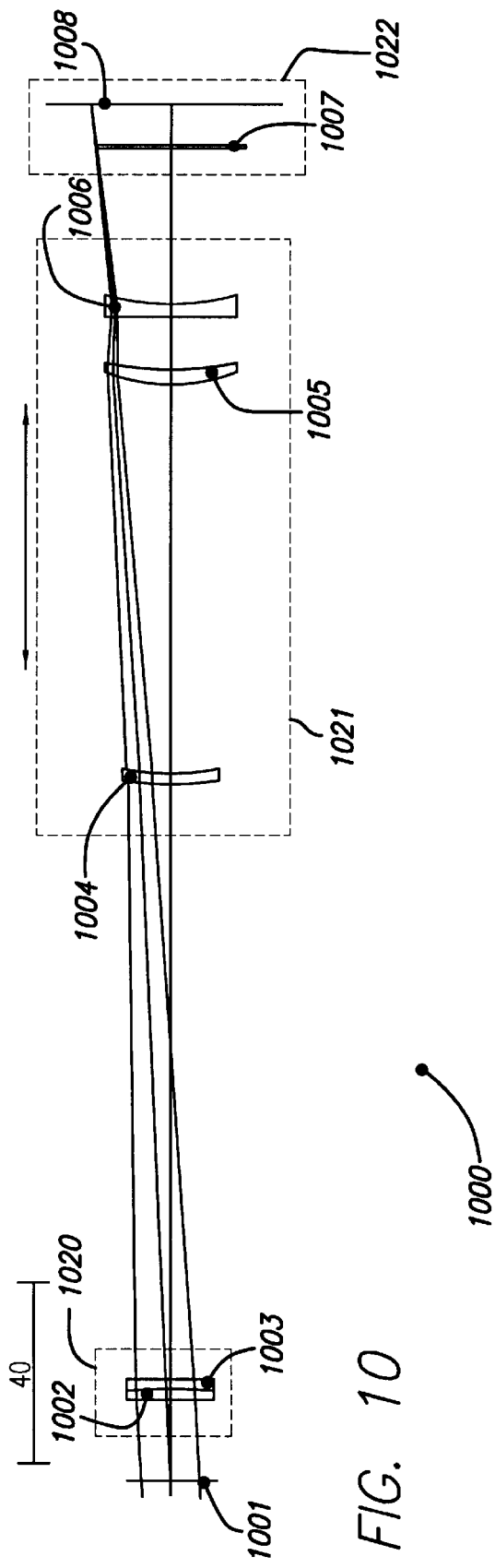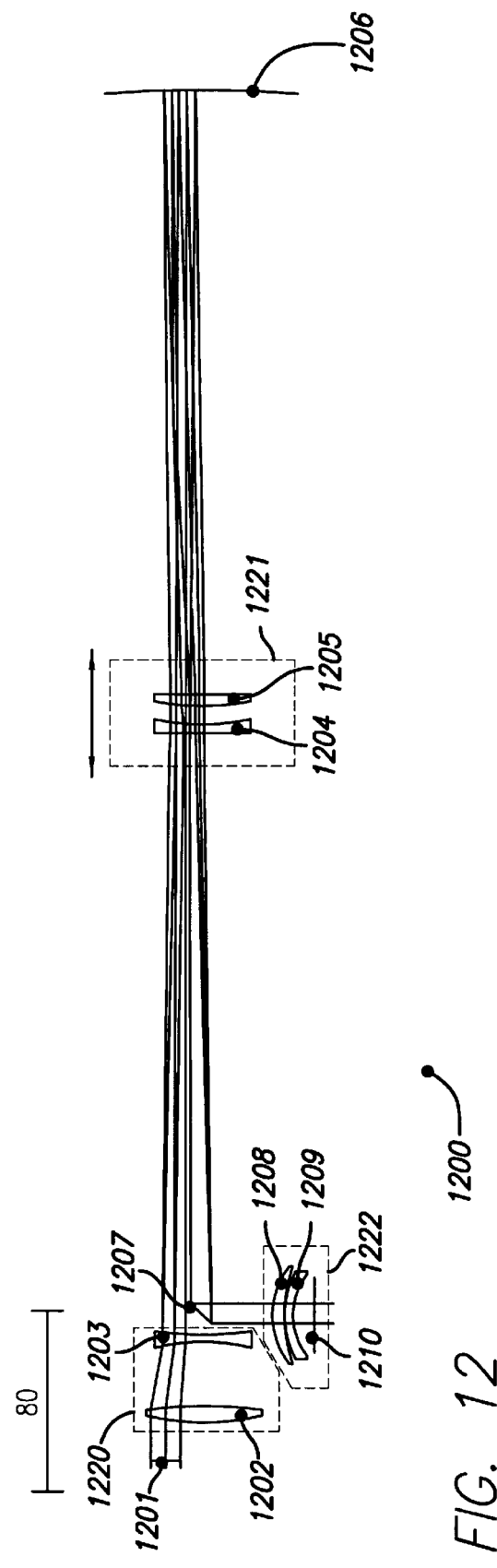

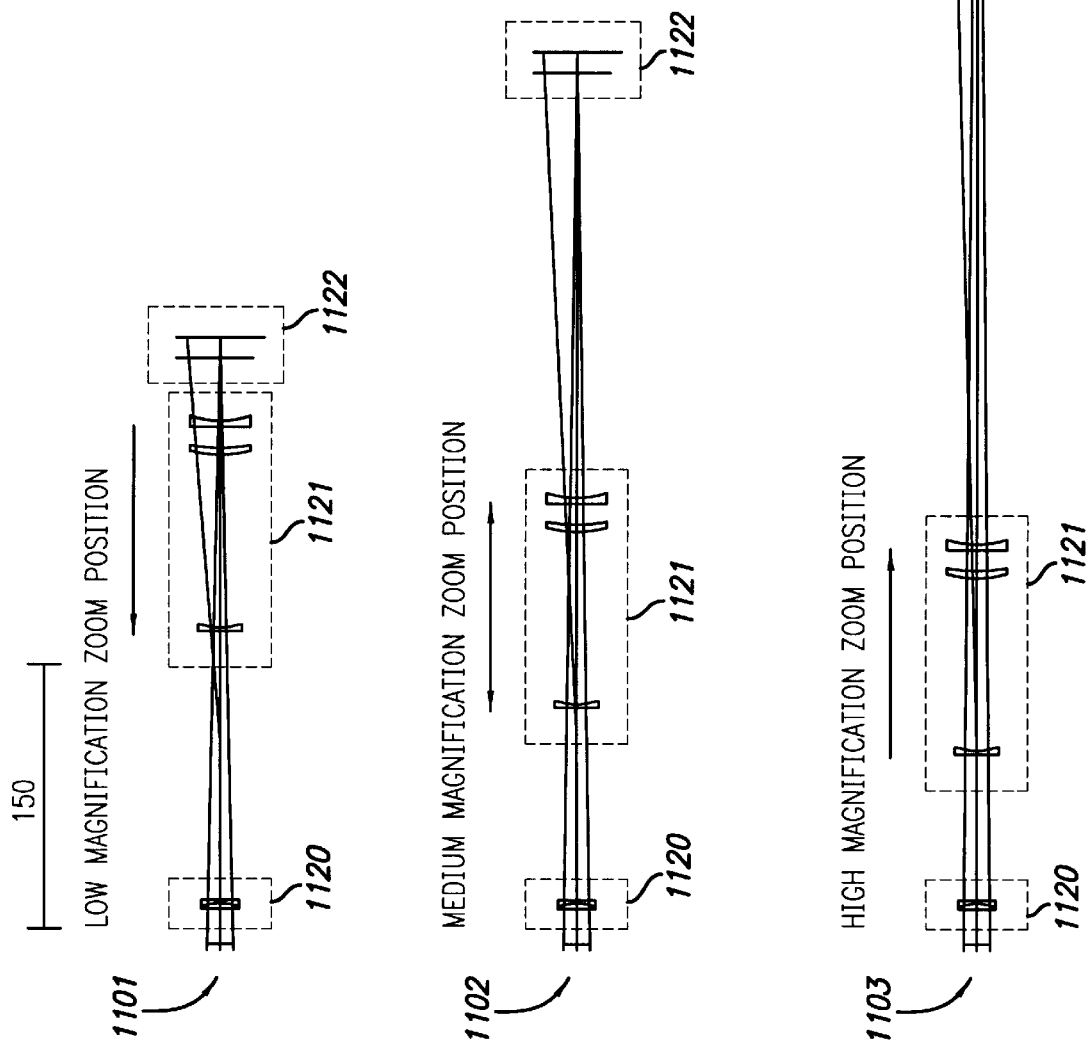

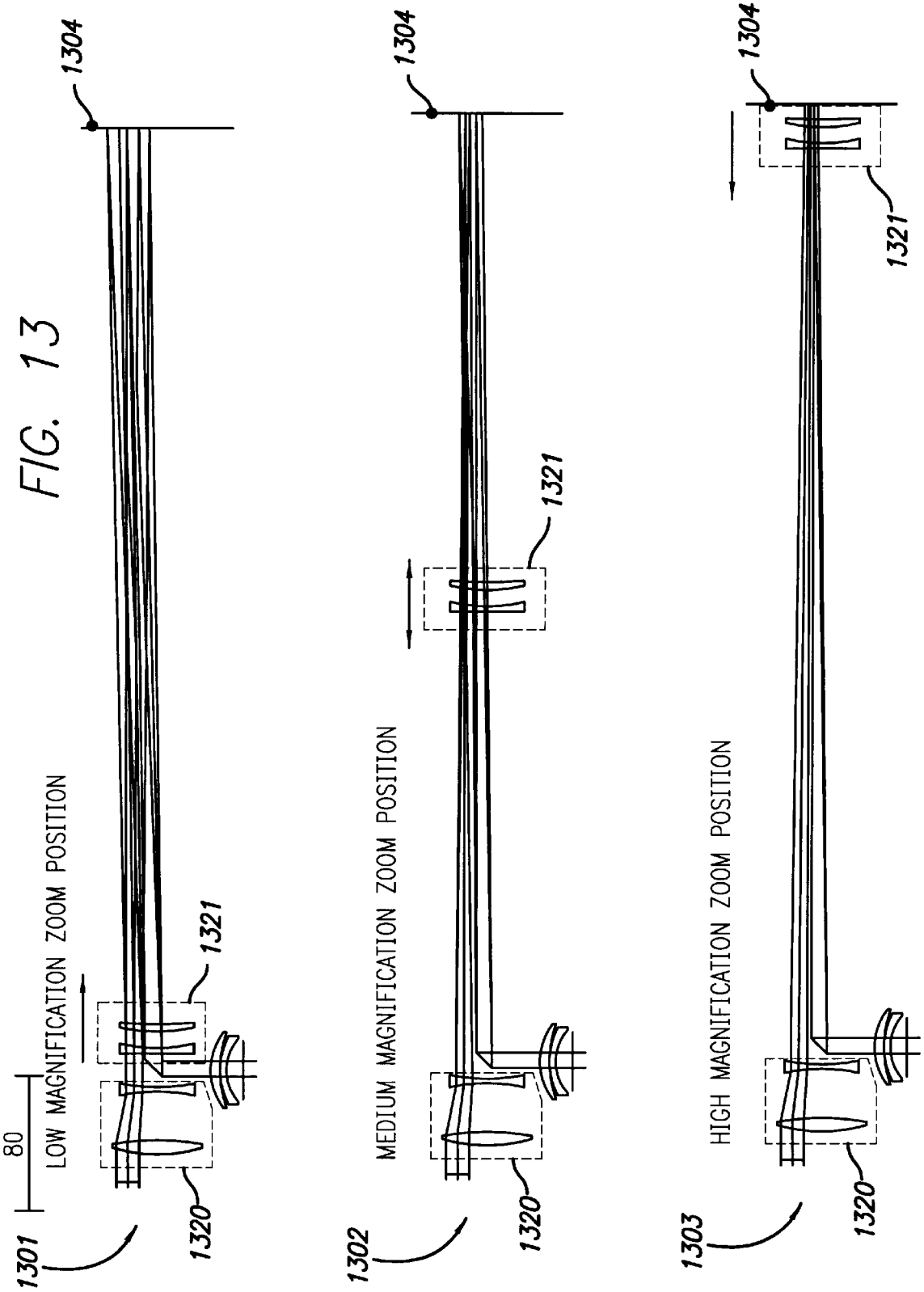

BROAD-BAND DEEP ULTRAVIOLET/ VACUUM ULTRAVIOLET CATADIOPTRIC IMAGING SYSTEM

This application is a continuation in part of U.S. application Ser. No. 09/046,814, now U.S. Pat. No. 6,064,517, entitled "High NA System for Multiple Mode Imaging," filed on Mar. 24, 1998, which is a continuation in part of application Ser. No. 08/908,247, now U.S. Pat. No. 5,999,310, entitled "Ultra-Broadband UV Microscope Imaging System with Wide Range Zoom Capability," filed on Aug. 7, 1997, which is a continuation in part of application Ser. No. 08/681,528, now U.S. Pat. No. 5,717,518, entitled "Broad Spectrum Ultraviolet Catadioptric Imaging System," filed on Jul. 22, 1996, all of which are hereby incorporated by reference.

BACKGROUND OF THE INVENTION

1. Field of the Invention

The present invention relates generally to the field of optical imaging and more particularly to catadioptric optical systems used for bright-field and dark-field imaging applications.

2. Description of the Related Art

Many optical and electronic systems exist to inspect object surfaces for defects such as those on a partially fabricated integrated circuit or a photomask. Defects may take the form of particles randomly localized on the surface of the circuit or photomask, as well as scratches, process variations, and so forth. Various imaging techniques used to perform surface inspection for such defects provide different advantages depending on the types of defects present.

Two well known imaging techniques for detecting defects are bright field imaging and dark field imaging. Bright field imaging is commonly used in microscope systems. The advantage of bright field imaging is the image produced is readily distinguishable. The size of image features accurately represents the size of object features multiplied by the magnification of the optical system. Bright field imaging can be more easily used with image comparison and processing algorithms for computerized object comparison, defect detection, and classification.

Dark field imaging has been successfully used to detect irregularities on object surfaces. The advantage of dark field imaging is that flat specular areas scatter very little light toward the detector, resulting in a dark image. Any surface features or objects protruding above the object scatter light toward the detector. Thus, in inspecting objects like semiconductor wafers, dark field imaging produces an image of features, particles, or other irregularities on a dark background.

One advantage of dark field imaging is that it provides a large signal for small features that scatter light. This large signal allows dark field imaging to detect smaller object features and provide faster object inspections than bright field imaging. Another advantage is that Fourier filtering can be used to minimize repeating pattern signals and enhance the defect signal-to-noise ratio.

Many dark field imaging techniques have been developed to enhance the detection of different types of defects. These techniques consist of a specific illumination scheme and collection scheme such that the scattered and diffracted light collected from the object provides the best signal. Several optical systems have been developed that use different dark field imaging techniques including laser directional dark field, double dark field, central dark ground, and ring dark field.

When employing either bright field or dark field imaging it is often desirable to use short wavelength illumination in the 300–400 nm ultraviolet (UV) range, 200–300 nm deep ultraviolet (deep UV or DUV) range, or 100–200 nm vacuum ultraviolet (vacuum UV or VUV) range. For bright field imaging short wavelength illumination provides improved resolution allowing the detection of smaller object features. For dark field imaging short wavelength illumination provides greatly increased scattering signals that allow the detection of smaller objects, an increase in inspection speed, or a decrease in the illumination power requirements. In addition, both bright field and dark field imaging can take advantage of changes in material absorption and reflectivities at short wavelengths. The changes in absorption and reflectivity of different materials at short wavelengths can help to identify these different materials. Also, many materials have greatly increased absorption at wavelengths in the DUV and VUV. Increased absorption can help improve optical inspection of upper surfaces, such as in semiconductor wafer inspection, by minimizing reflections interference from underlying layers.

Optical systems supporting bright field and dark field imaging typically require correction over some finite spectral bandwidth or wavelength range. Correction is necessary because different wavelengths have different glass indexes, known as dispersion. Conventional designs usually use two or three glass types to compensate for dispersive effects. Compensating for these dispersive effects is called color correction. Color correction in the UV, DUV, and VUV wavelength ranges is increasingly difficult. At shorter wavelengths, the glass dispersion greatly increases and is difficult to correct. In addition, at shorter wavelengths fewer and fewer glass materials may be used for correction.

At wavelengths shorter than 365 nm there are very few glass materials having high transmission. These materials typically include silica, $CaF_2$, $MgF_2$, and $LiF_2$. Of these materials, silica is most desirable to use in high end optical systems. Silica is a hard glass with low thermal expansion, no birefringence, high UV damage threshold, and is not sensitive to humidity. $CaF_2$, $MgF_2$, and $LiF_2$ are soft glasses which are difficult to polish, have high thermal expansion, some birefringence, and can be sensitive to humidity. Of these fluoride glasses, $CaF_2$ is the most desirable to use as an optical glass.

Minimizing the number of glass materials used in a UV, DUV or VUV optical system produces special challenges for correcting color aberrations. This is especially true in the VUV wavelength range where both silica and $CaF_2$ are extremely dispersive. Even a narrow spectral bandwidth at very short wavelengths can require the correction of numerous distinct color aberrations. Some important color aberrations that need to be corrected may include primary and secondary axial color, primary and secondary lateral color, chromatic variation of spherical aberration, and chromatic variation of coma.

At a wavelength of 157 nm, for example, $CaF_2$ is the only reasonable glass material that has high transmission and does not have severe problems with birefringence, water solubility, or mechanical softness. Standard color correction is not possible because no other glass material is available.

Another problem with currently available systems is that such systems provide a relatively short working distance between the optical system and the surface being inspected. Photomask inspection requires the working distance of the imaging system to be greater than approximately 6 millimeters due to the protective pellicle present on the photomask. A long working distance is also desirable in laser dark-field inspection environments. An imaging system having a long working distance makes it possible to directly illuminate the surface being inspected from outside the objective. Under typical circumstances, a working distance greater than 4 millimeters presents generally desirable attributes, while a working distance greater than 8 millimeters is preferred.

Further, a high numerical aperture (NA) provides advantages for high resolution imaging and collecting as large a solid angle as possible. It is highly desirable to achieve numerical apertures of 0.8, which corresponds to collecting angles above the surface from normal to 53 degrees.

A further problem with currently available systems is that while some relatively high NA systems exist, the central returning rays may be obscured due to apertures and other optical components. Such a central obscuration blocks low frequency information from the image and is undesirable.

Additionally, some presently available systems include internal pupil planes. A system having an internal pupil plane is undesirable because it does not readily support aperturing, particularly variations in aperture shapes, and Fourier filtering.

Finally, some currently available systems have limited field sizes. A large field size is often important for area imaging and to allow high speed inspection such as for semiconductor wafers and photomasks. Field size is typically limited by aberrations such as lateral color and chromatic variation of aberrations. Aberration correction is especially difficult if combined with chromatic correction for a large spectral bandwidth, high NA, long working distances, no central obscuration, and an external pupil plane.

Two prior patents describe high NA catadioptric systems that can support this type of imaging. These patents are U.S. Pat. No. 5,717,518 to Shafer et al. and U.S. Pat. Pat. No. 6,064,517 to Chuang et al, both assigned to KLA-Tencor Corporation and hereby fully incorporated by reference.

U.S. Pat. No. 5,717,518 describes an apparatus capable of high NA, ultra broad-band UV imaging. The '518 patent presents a 0.9 NA system for broad-band bright field and multiple wavelength dark-field imaging. The '518 system has a high degree of chromatic correction using a single glass material. Further correction is possible using two glass materials. The '518 system employs an achromatized field lens group to correct for secondary and higher order lateral color. This design has several limitations, including a limited working distance, central obscuration, internal pupil, and relatively tight manufacturing tolerances. The primary method for laser dark-field illumination in this scheme is to direct a laser through a hole or aperture in the spherical mirror element. This type of illumination can be quite complicated to implement.

U.S. Pat. No. 6,064,517 discloses an apparatus capable of combining ultra high NA, narrow-band UV imaging and multiple laser dark-field imaging techniques into a single optical system. The design is single wavelength and operates at numerical apertures up to 0.99. The '814 application is ideally suited for use in laser dark-field inspection, but has several limitations, including a relatively narrow working distance, a central obscuration, a narrow bandwidth, and relatively tight manufacturing tolerances. The system in the '517 patent uses a similar technique to that shown in the '518 patent for laser dark-field illumination and generally has similar advantages and limitations.

Other specialized catadioptric optical systems have been developed for use in semiconductor lithography. These systems are designed to image a photomask at a reduced magnification onto a resist coated wafer. Two prior patents describe high NA catadioptric systems that can support this type of imaging, specifically U.S. Pat. No. 5,052,763 to Singh et al. and European Patent Application number EP 0 736 789 A2 to Takahashi.

The '763 patent describes a catadioptric optical system capable of high NA imaging. This optical system is designed to create a substantially flat image field over the large areas required for semiconductor lithography. The design utilizes an input optical system having a curved field, a catadioptric relay system, and an output optical system to correct for the field curvature and some monochromatic aberrations. Limitations for the '763 design include a limited working distance, an internal pupil, a narrow bandwidth, an internal beamsplitter, and tight manufacturing tolerances.

The Takahashi European Patent Application presents a catadioptric optical system capable of high NA imaging. This optical system is designed to reduce the required diameter of the catadioptric mirror element for long distances to the wafer. The Takahashi design has an internal pupil, a narrow bandwidth using multiple glass materials, and tight manufacturing tolerances.

It is therefore desirable to provide a system for performing both bright field and dark field surface inspection having an objective which corrects image aberrations, chromatic variation of image aberrations, and longitudinal (axial) color and lateral color, including residual (secondary and higher order) lateral color correction over a broad spectral range. Such a system should be relatively inexpensive and easy to operate in typical environments, provide a relatively long working distance, large filed size, and have lenient tolerances. It is preferable to have such a system which operates at UV, DUV, or VUV wavelengths, a high numerical aperture, without central obscuration, and with an accessible pupil plane.

SUMMARY OF THE INVENTION

It is an object of the present invention to provide a system that is ideally suited to support both broad-band bright-field and laser dark field imaging and inspection.

It is another object of the present invention to provide a system having a high degree of chromatic correction using a minimum number of glass types, and even a single glass type.

It is a further object of the present invention to provide an apparatus that has a relatively long working distance between the optical system and the surface being inspected, a high numerical aperture, and no central obscuration. Such a system should have a working distance at least greater than 2 millimeters and preferably greater than 6 millimeters, with supporting numerical apertures as high as possible.

It is yet another object of the present invention to provide an inspection system having an external pupil plane to support aperturing and Fourier filtering.

It is still another object of the present invention to provide a system having relatively loose tolerances and which can be manufactured at a relatively reasonable cost.

These and other objects of the present invention are achieved by properly configuring the separate components of a catadioptric imaging system to interact with light in a precise and predetermined manner. The present invention is a catadioptric imaging method and apparatus for optical imaging and inspection. The design approach disclosed herein is ideally suited for both bright field and dark field imaging and inspection at wavelengths at or below 365 nm. In many instances, the lenses used in the system disclosed herein may be fashioned or fabricated using a single material, such as calcium fluoride or fused silica.

The first embodiment uses the catadioptric optical system as an apparatus for photomask inspection. This embodiment consists of illumination optics such as transmission illumination optics or reflected illumination optics, a long working distance catadioptric imaging objective, image forming optics, and a detector.

The second embodiment uses this optical system as an apparatus for laser dark field inspection. This apparatus consists of illumination optics, such as a laser illumination element, a long working distance catadioptric imaging objective, a Fourier filter or aperture at the external pupil plane, image forming optics, and a detector.

Several additional embodiments describe the optical apparatus in the following detailed description. Two basic catadioptric objective design approaches are employed in these embodiments. Both approaches take advantage of multiple internal images for aberration correction and to produce a design with no central obscuration. The first design approach uses a reflective lens mirror element that is folded such that the optical axis is at an angle to the optical axis of the major refractive components. The second design approach uses a reflective lens mirror element that has its optical axis mostly coincident with the optical axis of the major refractive components. Each of these design approaches can correct for at least 1 nm of spectral bandwidth at 193 nm using a single glass material. The design can also correct for 0.5 nm of spectral bandwidth at 157 nm. Addition of a second glass material provides the ability to increase spectral bandwidth. For example, at 193 nm, the spectral bandwidth can be increased to greater than 10 nm using silica and $CaF_2$ glass.

The second design approach has the optical axis of a Mangin mirror coincident or nearly coincident with the optical axis of the refractive components. This design provides relatively relaxed manufacturing tolerances and increased design flexibility.

The image forming optics highly important in both the first and second embodiments. Two possible design options are presented for the image forming optics. These two options are a dual motion varifocal zoom and a single motion optically compensated zoom. Both zoom options provide a range of magnifications that would be useful in the first or second embodiments. Both of these zoom options can provide high quality images when combined with the catadioptric objective approaches described herein.

Several additional advantages are achieved with the current invention. First, the designs can be implemented using a single glass type for each of the lenses, thereby facilitating production of an imaging system which utilizes the single best refractive material for broad band UV, DUV, or VUV applications.

Other significant advantages of the current invention include the ability to correct for primary, secondary, and higher order chromatic variations in focus, as well as correction for primary, secondary, and higher order lateral color, and corrections made for the chromatic variations of aberrations such as spherical, coma, and astigmatism.

An additional advantage of the current invention is the excellent performance with a broad bandwidth, long working distance, high NA, and a large flat field.

There has been outlined rather broadly the more important features of the invention in order that the detailed description thereof that follows may be better understood, and in order that the present contribution in the art may be better appreciated. These and other objects and advantages of the present invention will become apparent to those skilled in the art from the following detailed description of the invention and the accompanying drawings. Those skilled in the art will appreciate that the conception on which this disclosure is based may readily be utilized as the basis for the designing of other arrangements for carrying out the several purposes of the invention. It is important therefore that this disclosure be regarded as including such equivalent arrangements as do not depart from the spirit and scope of the invention.

DESCRIPTION OF THE DRAWINGS

FIG. 1 illustrates a method of optical imaging and bright field and ring dark field inspection at wavelengths at or below 365 nm;

FIG. 2 illustrates a method of optical imaging and inspection using laser dark-field at wavelengths at or below 365 nm;

FIG. 3 is an example folded 0.7 NA catadioptric objective utilizing a single glass material;

FIG. 4 illustrates the effect of the lateral separation between rays transmitted to and received from the Mangin mirror;

FIG. 7 presents an embodiment of the invention having an in-line or straight 0.7 NA catadioptric objective employing a single glass material;

FIG. 8 presents an embodiment of the invention optimized for a wavelength of 157 nm wherein the lenses shown are fashioned from calcium fluoride;

FIG. 10 presents an embodiment of the image forming optics using a varifocal two motion zoom;

FIG. 11 presents three different magnifications possible with the varifocal zoom;

FIG. 12 presents an embodiment of the image forming optics using a single motion optically compensated zoom; and FIG. 13 presents three different magnifications possible with the optically compensated zoom.

DETAILED DESCRIPTION OF THE INVENTION

Figure 5:
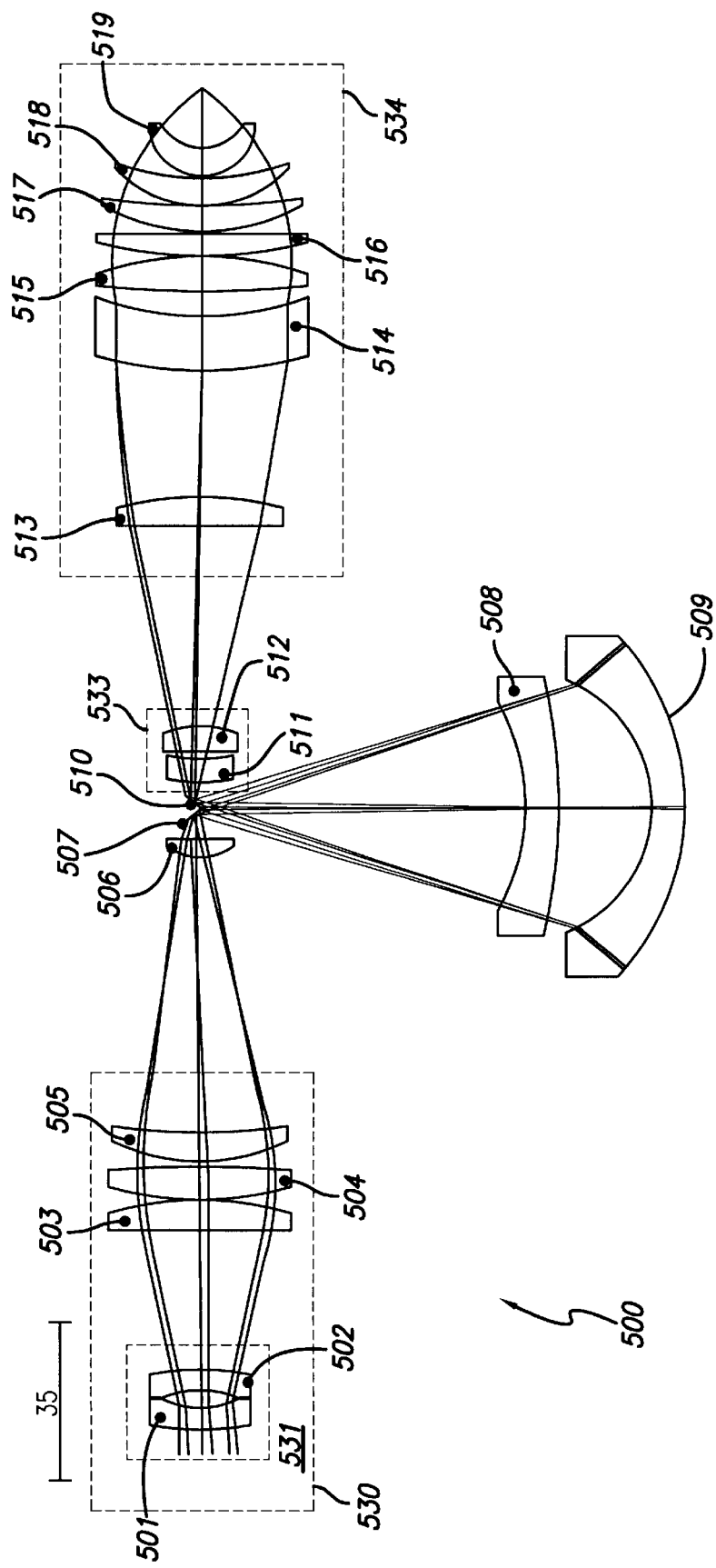
FIG. 5 presents an embodiement of the design that provides narrow band aberration correction to give a 0.7 NA, long working distance, unobscured design using only fused silica.

FIG. 1 illustrates a first embodiment of the current invention, including a method of bright field or ring dark field inspection. This method is particularly suited for photomask or wafer inspection, and consists of illumination optics such as transmission illumination source 101 or reflected illumination source 105, a long working distance catadioptric imaging objective 102, image forming optics 103, and a detector 104. For wafer inspection, only reflected light illumination is required. The design of the long working distance catadioptric objective and the image forming optics are enabling technologies for photomask inspection at wavelengths at or below 365 nm. Optical designs that support this photomask inspection method using a single material and two materials will be disclosed in embodiments 3–10. The optics and detector are all carefully designed and optimized for the wavelength and spectral bandwidth of the illumination, as will be detailed below.

Different illumination sources may be employed in this design and incorporated in the transmitted light illumination 101 and reflected light illumination 105 and with the designs of embodiments 3–10 and with respect to FIGS. 3–13. These light sources include but are not limited to lasers and lamps. Many different lasers are available at wavelenghts at or below 365 nm including argon (364, 351, 333, 275 nm), frequency converted lasers (351 nm, 266 nm, 213 nm), helium cadmium (325 nm), xenon chloride excimer (308 nm), krypton fluoride excimer (248 nm), argon fluoride excimer (193 nm), fluorine (157 nm), and argon excimer (126 nm). In addition, different wavelength lasers are possible using frequency mixing techniques. Many different lamp sources are available including mercury xenon (365–220 nm), cadmium lamp (210–220 nm), deturium (150–190 nm), as well as various excimer lamps. These sources can have very different spectral bandwidths. For example, an unnarrowed excimer laser, a lamp having a bandpass filter, or a frequency converted laser can each produce light having a 1 nm bandwidth or less. An unfiltered lamp or lamp with a larger bandpass filter, such as an arc lamp, excimer lamp, or a deuterium lamp, are also possible sources having bandwidth greater than 1 nm. Relatively few light sources are available at 193 nm and 157 nm wavelengths. Of these light sources, excimer lasers have the brightness required to support high speed photomask inspection.

The illumination used in the embodiment illustrated in FIG. 1 can be either transmitted light, shown as transmitted illumination source 101, reflected light, shown as reflected illumination source 105, or both. The illumination may also be in the form of a ring such as required for ring dark field imaging. For example, this ring illumination can be obtained by placing a ring shaped aperture at or near a pupil plane located in the illumination system. This aperture blocks small illumination angles near the optical axis of the pupil and allow higher illumination angles away from the optical axis of the pupil. This ring should preferably be matched to a similar ring in the catadioptric objective or image forming optics such that all the rays from the illumination ring are blocked in in the image.

Note that in the case of the reflected illumination source that the system employs beamsplitter/reflector 106. In the case of transmitted illumination using transmitted illumination source 101, photomask 107 is disposed between transmitted illumination source 101 and objective 102.

The illumination system for transmitted light preferably employs a condenser objective. The purpose of the condenser objective is to illuminate a region nominally the same size as the imaging region on a wafer or photomask. As the condenser objective is used only for illumination, it does not require high optical quality. Such an objective can be a reduced performance version of the catadioptric objectives presented in this invention or a simple all refractive design. Such designs are achievable by those skilled in the art when presented with this disclosure. The illumination for reflected light uses a beamsplitter and is implemented as in a standard microscope.

The long working distance imaging objective 102 includes the lensing arrangements described in embodiments 3 through 8 and illustrated in FIGS. 3–13. For photomask inspection, these designs should fulfill certain basic requirements. The objective working distance should be greater than 6 mm so as not to interfere with a pellicle that protects the reticle. The objective should also preferably be well corrected for aberrations over the bandwidth of the illumination source. Many of the available illumination sources have a bandwidth greater than the 1–2 nm bandwidth obtained from a standard type of single material all refractive objective design. An example of this is an unnarrowwed excimer laser that typically has a spectral bandwidth around 1 nm. The catadioptric designs in embodiments 3–8 address this problem.

The objective should also have the ability to image over a relatively large field. Large fields and high data acquisition rates are essential to make inspecting the photomask as fast as possible.

The image forming optics 103 are corrected over the spectral bandwidth of the illumination source and the catadioptric imaging objective. The image forming optics 103 are also capable of various magnifications required in a photomask inspection environment. The image forming optics 103 and the catadioptric objective 102 may each and together be fully corrected for aberrations. Such aberration correction permits testing the image forming optics 103 and the catadioptric objective 102 as separate units. Alternately, aberration correction may be shared between the catadioptric objective 102 and the image forming optics 103. In general the optical design for shared aberration correction can be simpler to fabricate, but testing of the image forming optics and the catadioptric objective can be more complex.

The image forming optics or catadioptric objective can alternately contain a ring aperture at or near a pupil plane such as required for ring dark field imaging. This aperture should block all direct illumination light from reaching the detector, corresponding to a similar aperture in the illumination. Thus the illumination aperture would be a transmissive ring and the imaging aperture would be a corresponding opaque ring.

Combinations of bright field imaging and ring dark field imaging are also possible. Bright field and dark field may be combined on separate detectors or on the same detector at the same times or in an alternate fashion, as is generally known in the art. When bright field and dark field imaging is performed on the same detector at the same time, the relative intensity and phase of the light energy can be modified by suitable apertures in the illumination and imaging.

The detector 104 is preferably a high speed detector capable of the high data rates used for inspection systems. Detector 104 can be a single point diode type detector or an area type detector such as a CCD or a CCD operating in the Time Delay and Integration (TDI) mode. Ideally, this detector should have a high quantum efficiency, low noise, and a good Modulation Transfer Function (MTF). Back thinned CCD sensors are particularly well suited for this purpose.

The second embodiment is a method for laser dark-field inspection at or below 365 nm, and is illustrated in FIG. 2. The embodiment illustrated in FIG. 2 is especially suited for wafer and photomask inspection. The apparatus of FIG. 2 consists of illumination optics, such as laser illumination element 201, a long working distance catadioptric imaging objective 202, a Fourier filter or aperture 203 at the external pupil plane, image forming optics 204, and a detector 205. Catadioptric imaging designs using a single material in the configuration of FIG. 2 preferably use an illumination source having a 1 nm or less bandwidth. Catadioptric imaging designs using two glass materials are achievable when using an illumination source with greater than 1 nm bandwidth.

The types of illumination that can be used for this system are similar to those used in the first embodiment for bright field and ring dark field inspection. The preferred energy or light source is a laser due to its directionality and brightness. One method or apparatus for laser-dark field illumination of a semiconductor specimen is direct illumination of the specimen from outside the objective. In such an arrangement, only light scattered from the specimen is collected by the catadioptric objective. The specularly reflected beam is beyond the numerical aperture of the objective and is not collected.

Again, the long working distance imaging objective 202 is described in embodiments 3 through 8 and with respect to FIGS. 3–13. For laser dark field inspection, these designs fulfill certain basic requirements. The long working distance offered by the designs of FIGS. 3–13 simplifies delivering laser energy to the wafer in the semiconductor specimen environment from outside the objective without interfering with the operation of the imaging system. The objective is preferably also well corrected for aberrations over the bandwidth of the illumination source 201. Many of the available illumination sources have a bandwidth that is greater than the 1–2 nm bandwidth obtained from a standard type of single material all refractive objective design. An example of this is an unnarowwed excimer laser that typically has a spectral bandwidth around 1 nm. The catadioptric designs in embodiments 3–8 address this problem. The objective 202 images over a large field, as large fields and high data acquisition rates provide for rapid wafer or photomask inspection.

The objective also preferably has an easily accessible pupil plane to support Fourier filtering or aperturing, such as by the Fourier filter or aperture 203. Fourier filtering can reduce the noise caused by repeating patterns on the wafer, thereby permitting smaller random defects to be more readily detected.

The image forming optics 204 are preferably corrected over the spectral bandwidth of the illumination and the catadioptric imaging objective 202. The image forming optics 204 also preferably support the various magnifications required by a dark field inspection system. One implementation of the image forming optics 204 is to have them and the catadioptric objective 202 each fully corrected for aberrations. Such a system allows simplified testing of image forming optics 204 and the catadioptric objective 202 as separate units. An alternate technique is sharing aberration correction between the catadioptric objective 202 and the image forming optics 204. Such an approach can be mechanically or optically simpler, but can complicate image forming optics and catadioptric objective testing.

Again, as in the first embodiment shown in FIG. 1, the detector 205 of FIG. 2 is preferably a high speed detector capable of the high data rates used for an inspection system. Detector 905 can be a single point diode type detector or an area type detector such as a CCD or a CCD operating in the TDI mode. Ideally, this detector should have a high quantum eefficiency, low noise, and a good MTF. Such detectors are generally known to by those skilled in the art.

The design of FIGS. 1 and 2 can support bright field, laser directional dark field, ring dark field, and simultaneous bright-field and dark-field schemes, where each of these schemes can be achieved in the presence of UV, DUV, and VUV wavelengths. The opaqueness of CMP layers in the deep UV and VUV ranges makes a system using this objective ideally suited to finding surface defects and microscratches on semiconductor wafers.

The catadioptric optical apparatus presented to support bright field and dark field imaging and inspection are also ideal for use in a variety of other applications. The design can be easily optimized by someone skilled in the art for wavelengths from the visible range to the deep UV range and to the vacuum UV range. Longer wavelengths can be optimized for larger bandwidths because the glass dispersion is less. For example, bandwidths of greater than 140 nm are possible with a two material design and a center wavelength of 300 nm. The light energy can include shorter wavelengths and the design permits use of multiple wavelengths. For semiconductor inspection, the designs presented can support bright field, laser directional dark field, ring dark field, and simultaneous bright-field and dark-field schemes. The optical designs presented are also ideally suited for use as a lithography lens or for lithography simulation, a research tool for micro-electronic development, florescence measurements, or in biology where a long working distance is required for sample clearance. Due to the ability of this objective to provide applications in the presence of extremely varied light wavelengths and spectral bandwidths, the designs in FIGS. 1 and 2 are well suited for florescence measurements.

FIG. 3 illustrates a third embodiment of the present invention. This third embodiment is simple example of a folded 0.7 NA catadioptric objective 300 utilizing a single glass material, provided herein to explain the aberration correction and objective functionality. As with the other figures discussed herein, FIG. 3 includes a line in the upper left corner indicating a reference measurement of the size, in millimeters, of the associated line.

Also, as in other figures discussed herein, light is shown entering from the left side of FIG. 3 from an energy source 3000 (not shown).

The energy from the energy source 3000 is focused by a group of positive and negative lenses 301 arranged in either a telephoto or inverse telephoto configuration. The positive lens may be either in the front or in the back of the arrangement, where front and back are relative terms with respect to the energy source. Here negative lens 302 is in front of positive lens 303, where negative lens 302 and positive lens 303 form the group of positive and negative lenses 301. A positive field lens 304 is located somewhat in front of the focus for lens group 301. Very close to the small image formed is located a relatively small pair of flat fold mirrors 305 arranged in a V-shape. The first small flat mirror 305a reflects the light at 90 degrees to the optical axis. Some other angular amount may be used depending on the application desired while still within the scope of the present invention.

The diverging light then proceeds to the Mangin mirror 306 located at the bottom of FIG. 3. A Mangin mirror is a lens/mirror element that is refractive and has a reflective back surface. The Mangin mirror 306 re-images the first image onto the second small flat folding mirror 305b, at substantially unit magnification. The system is implemented far enough off axis such that the returning second image is displaced laterally enough from the first image so that the lateral separation permits optical manipulation of each separate image. The amount of lateral separation allows the second small flat mirror 305b to fold the light path back onto the original optical axis. This effect is illustrated in FIG. 4.

According to FIG. 4, the input rays in the field of the substantially unit magnification Mangin mirror relay are on one side of the field and the output rays are on the opposite side. From FIG. 3, the second small fold mirror 305b is followed by a second field lens 307. From there the light proceeds up to the final focusing lenses 308 discussed below. This final focusing lens group 308 provides a relatively long working distance to the surface of the specimen, such as the photomask or semiconductor wafer.

If the two field lenses were not present in the design of FIG. 3, this design would constitute an application of the Schupmann type design using a Mangin mirror. The Mangin mirror would provide the means by which the virtual image of the Schupmann system would be turned into a real image, just as shown in previously known systems. This new configuration provides two significant advantages over the previous designs: lack of obscuration and a relatively long working distance. Both advantages result from the novel arrangement of the small fold mirrors 305, the substantially unit magnification Mangin mirror 306, and the presence of the two intermediate images in the system.

The small fold mirrors 305 can be implemented in a variety of ways. Objective designs can be optimized where these fold mirrors are on the sides of the field lenses opposite to the internal images. Objective designs can also be optimized where the small fold mirrors are on the side of the internal image closest to the Mangin mirror. Also, a prism or prisms can be used for the reflective surfaces. A reflective coating can be added to one or more of the prism surfaces, such that the two prisms can be used as reflective mirrors. Alternately, one prism can have two surfaces coated and serve as both reflective surfaces. This is advantageous because a highly accurate angle can be polished on the prism to define the angle of the optical axis. The prisms can also be used in total internal reflection mode. This is advantageous when high efficiency optical coatings are difficult, such as for short wavelengths or broad spectral bandwidths. In this mode, the hypotenuse of a near 90 degree prism is used in total internal reflection, replacing a reflecting surface. The surfaces of the prism that are near normal to the incoming and reflecting beams may be anti-reflection coated to improve transmission efficiency.

Addition of one field lens to the system, in either of the two locations where the design has its two field lenses, provides the ability to correct the design for either secondary axial color or primary lateral color. Primary axial color is corrected without field lenses by balancing the positive refractive power of the Mangin mirror element 306 with the positive power of the lenses, as in connection with the Schumpmann principle. Use of two field lenses 304 and 307 near the intermediate images provides for correction of both secondary axial color and primary lateral color. The result is a design with a fairly broad spectral range having good axial color correction, but one that is limited by secondary axial color. Correction of the secondary lateral color can be accomplished by balancing the secondary color between the first half of the system with the second half of the system, where the first half of the system includes all lenses from the incoming energy source up to the reflective portion of the Mangin mirror 306, including lens group 301, field lens 304, first small fold mirror 305a, and Mangin mirror 306. This secondary lateral color balancing scheme works well due to the two intermediate images produced as in FIG. 4 and the two separate field lenses 304 and 307 present in the system. As in known systems, tertiary axial color is improved by moving the field lenses 304 and 307 a significant distance to one side of the intermediate images.

The present invention presented is a catadioptric system requiring a single refractive material, in conjunction with the particularly described arrangement of mirrors, to correct for chromatic aberrations. For a design intended for use in the presence of an energy source wavelength near 193 nm, the preferred lens material is silica. For a similar design intended for use in wavelengths near 157 nm, the preferred lens material is $CaF_2$. At 157 nm wavelength, for example, $CaF_2$ is preferred since it does not have severe problems with birefringence, water solubility, or mechanical softness. Further chromatic correction can also be achieved using two glass materials, but such an arrangement may require additional cost or present birefringence, water solubility, or mechanical softness drawbacks.

Special challenges are presented when correcting various color aberrations when only one glass type is used. Conventional designs usually use two or three glass types to correct color aberrations. The present invention performs the correction in the presence of a single material type used in all lenses due to the specific lens and mirror configuration. In very deep UV, both silica and $CaF_2$ are highly dispersive, so even a narrow spectral bandwidth at very short wavelengths can require the correction of quite a few distinct color aberrations. Such color aberrations may include primary and secondary axial color, primary and secondary lateral color, chromatic variation of spherical aberration, and chromatic variation of coma. In the present invention, lens and mirror positioning permits primary axial and lateral color to be completely corrected. Secondary axial and lateral color cannot be completely corrected, but can be kept small enough to be acceptable over a relatively narrow spectral bandwidth. Chromatic variation of both spherical aberration and coma can also be corrected using this small fold mirror and dual field lens design. The physical separation between positive and negative axial color contributions present in the design of FIG. 3, particularly the separation to positionally disparate locations within the design, leads to special problems in correcting the chromatic variation of aberrations.

Minimiztion of chromatic aberration variations requires a very particular arrangement of lens powers and shapes such as illustrated in FIG. 3 and later in embodiments 4–8.

The design of FIG. 3 provides an optical system having a long working distance between the optical system and the surface being inspected, particularly between the final lens in the system 308 and the surface of the object or specimen 309 (not shown) being imaged. The arrangement of FIG. 3 further provides a high numerical aperture and no central obscuration. A high numerical aperture provides for high resolution imaging and collecting as large an angular range above the surface being imaged as possible. Numerical apertures of greater than 0.8 can be achieved with excellent performance. A numerical aperture of 0.8 corresponds to collecting angles above the surface from normal to 53 degrees.

Further, unlike many catadioptric optical systems, the design of FIG. 3 has no central obscuration to block low frequency information. The FIG. 3 design does not have this problem and permits utilization of all low frequency information.

The design illustrated in FIG. 3 also provides relatively reasonable tolerances which can be more easily manufactured. The benefit of reasonable tolerances in the design of FIG. 3 is that it overcomes problems present in many known high NA, broad bandwidth systems having some optical elements with very tight position and thickness tolerances. These tight tolerances may make previous designs either too expensive or in some cases impossible to build and operate in a production environment.

FIG. 5 shows a more complex version of the design that provides additional narrow band aberration correction to give a 0.7 NA, long working distance, unobscured design using only fused silica. The object extends from 0.25 mm to 0.75 mm off axis and the design has a bandwidth of 1 nm from 192.8–193.8 nm. The surface data for an example of this type of design is listed in Table 1. Performance for the system shown in FIG. 5 is limited by chromatic variation in aberrations rather than higher order axial color. Other versions are possible and would require minimal effort by those of ordinary skill when presented with this disclosure.

As illustrated in FIG. 5, energy, such as laser energy, is transmitted from energy source 5000 (not shown) and into objective 500. Objective 500 includes lens arrangement 530, which includes a first lens pair 531 including first lens 501 and second lens 502, followed by third lens 503, fourth lens 504, and fifth lens 505. Energy is focused by lens arrangement 530 toward field lens 506, which then directs energy toward the small folding mirror or reflecting surface, here specifically first mirror 507. Energy is directed from first mirror 507 toward lens 508 and to Mangin mirror 509, which reflects light energy back through lens 508 and toward the second part of the small folding mirror or reflecting surface, specifically to second mirror 510.

In FIG. 5, light is reflected from second folding mirror 510 to field lens 533, which includes first field lens 511 and second field lens 512. From the field lens 533, light is transmitted to focusing lens arrangement 534, which includes first focusing lens 513, second focusing lens 514, third focusing lens 515, fourth focusing lens 516, fifth focusing lens 517, sixth focusing lens 518, and seventh focusing lens 519. The specimen or surface 520 to be examined is not shown in FIG. 5, but is located to the right of the objective 500 in the orientation of FIG. 5. Light energy strikes the specimen and reflects back through the objective 500 of FIG. 5. Alternately, light energy can transmit through the specimen and then through the objective 500 from right to left as shown in FIG. 5.

TABLE 1

Surface data for the folded design of FIG. 5 operating at 193 nm wavelength with a 1 nm bandwidth

| Surf | Radius | Thickness* | Material | Element Number |
|---|---|---|---|---|
| OBJ | Infinity | Infinity | | N/S** |
| STO | Infinity | −32.038 | | N/S |
| 2 | 81.983 | 5.000 | Silica | 501 |
| 3 | 18.305 | 4.216 | | 501 |
| 4 | −27.049 | 5.000 | Silica | 502 |
| 5 | −61.738 | 33.261 | | 502 |
| 6 | 1276.054 | 7.000 | Silica | 503 |
| 7 | −83.831 | 0.500 | | 503 |
| 8 | 79.482 | 8.000 | Silica | 504 |
| 9 | −229.250 | 1.000 | | 504 |
| 10 | 47.191 | 7.000 | Silica | 505 |
| 11 | 138.080 | 66.471 | | 505 |
| 12 | 14.544 | 4.000 | Silica | 506 |
| 13 | 514.189 | 7.697 | | 506 |
| 14 | Infinity | 0.000 | Mirror | 507 |
| 15 | Infinity | −77.947 | | 507 |
| 16 | 50.786 | −8.000 | Silica | 508 |
| 17 | 139.802 | −22.299 | | 508 |
| 18 | 32.934 | −8.000 | Silica | 509 |
| 19 | 60.774 | 8.000 | Mirror | 509 |
| 20 | 32.934 | 22.299 | | 509 |
| 21 | 139.802 | 8.000 | Silica | 508 |

TABLE 1-continued

Surface data for the folded design of FIG. 5 operating at 193 nm wavelength with a 1 nm bandwidth

| Surf | Radius | Thickness* | Material | Element Number |
|---|---|---|---|---|
| 22 | 50.786 | 77.947 | | 508 |
| 23 | Infinity | 0.000 | Mirror | 510 |
| 24 | Infinity | −3.500 | | 510 |
| 25 | Infinity | −2.500 | | 510 |
| 26 | −50.929 | −5.724 | Silica | 511 |
| 27 | −41.159 | −1.814 | | 511 |
| 28 | 302.166 | −6.000 | Silica | 512 |
| 29 | 24.557 | −48.713 | | 512 |
| 30 | 544.674 | −6.500 | Silica | 513 |
| 31 | 89.379 | −30.822 | | 513 |
| 32 | −90.727 | −12.569 | Silica | 514 |
| 33 | −64.505 | −6.000 | | 514 |
| 34 | −233.637 | −8.000 | Silica | 515 |
| 35 | 83.534 | −0.500 | | 515 |
| 36 | −92.578 | −5.679 | Silica | 516 |
| 37 | 1208.052 | −0.500 | | 516 |
| 38 | −50.386 | −5.8316 | Silica | 517 |
| 39 | −146.956 | −0.500 | | 517 |
| 40 | −30.274 | −5.971 | Silica | 518 |
| 41 | −56.351 | −0.500 | | 518 |
| 42 | −12.744 | −7.155 | Silica | 519 |
| 43 | −12.195 | −14.453 | | 519 |
| 44 | Infinity | 1.68E−05 | | N/S |
| IMA | Infinity | | | N/S |

*Surface thickness represents the thickness of a surface when at the "upstream" side of the element or distance between the surface and the next surface if at the "downstream" side of the element. For example, surface 2 on element 501 has a radius of 81.983 millimeters and the lens is 5.000 millimeters thick. Surface 3 of lens element 501 has a radius of 18.305 millimeters and is 4.216 millimeters from the next surface, which is surface 4 on element 502.
**Certain elements relating to but not critical to the design are not shown in the FIGS.

Figure 6:
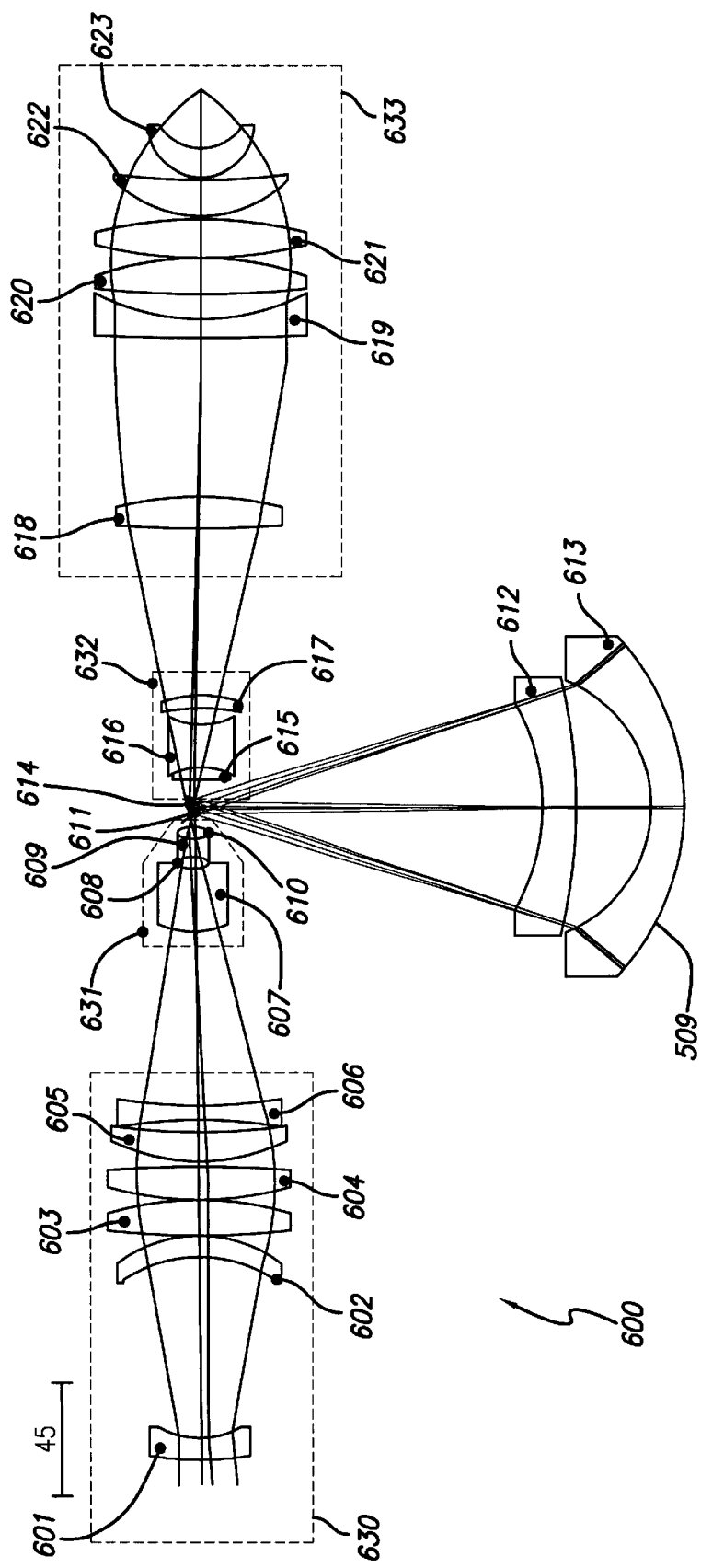
FIG. 6 presents an embodiment of the invention having a folded 0.7 NA catadioptric objective using silica and calcium fluoride to further increase system bandwidth.

A fourth embodiment of the invention is presented in FIG. 6. FIG. 6 illustrates a folded 0.7 NA catadioptric objective using two materials. This design uses silica and calcium fluoride to further increase system bandwidth. Calcium fluoride is added to the field lenses in this design make both such lenses achromats. The design of FIG. 6 is corrected for light energy from 193 to 225 nm. Surface data for a system of the fourth embodiment is presented in Table 2.

As shown in FIG. 6, light energy or laser energy is transmitted from energy source 6000 (not shown) and into objective 600. Objective 600 includes a lens arrangement 630, which includes first lens 601, second lens 602, third lens 603, fourth lens 604, fifth lens 605, and sixth lens 606. Energy is focused by lens arrangement 630 toward field lens arrangement 631, which includes seventh lens 607, eighth lens 608, ninth lens 609, and tenth lens 610. Eighth lens 608 and tenth lens 610 are formed of calcium fluoride ($CaF_2$). This field lens arrangement 631 directs light energy to first small folding mirror or reflecting surface 611, which directs energy toward lens 612 and to Mangin mirror 613. Light energy reflects back from Mangin mirror 613 back through lens 612 and toward the second part of the small folding mirror or reflecting surface, specifically to second mirror 614.

Light is reflected from second folding mirror 614 to second field lens arrangement 632, which includes first field lens 615, second field lens 616, and third field lens 617. Both first field lens 615 and third field lens 617 are formed of calcium fluoride. From the field lens arrangement 632, light energy is transmitted to focusing lens arrangement 633, which includes first focusing lens 618, second focusing lens 619, third focusing lens 620, fourth focusing lens 621, fifth focusing lens 622, and sixth focusing lens 623. The specimen or surface 624 to be examined is not shown in FIG. 6, but is located to the right of the objective 600 in the orientation of FIG. 6.

TABLE 2

Surface data for a folded design at 193 nm with a 32 nm bandwidth

| Surf | Radius | Thickness | Material | Element Number |
|---|---|---|---|---|
| OBJ | Infinity | Infinity | | N/S |
| STO | Infinity | −32.204 | | N/S |
| 2 | −101.014 | 3.000 | Silica | 601 |
| 3 | 25.381 | 74.761 | | 601 |
| 4 | −29.809 | 5.000 | Silica | 602 |
| 5 | −31.309 | 1.000 | | 602 |
| 6 | 183.355 | 7.500 | Silica | 603 |
| 7 | −109.361 | 0.500 | | 603 |
| 8 | 99.287 | 7.000 | Silica | 604 |
| 9 | −250.439 | 1.000 | | 604 |
| 10 | 50.010 | 5.500 | Silica | 605 |
| 11 | 118.693 | 3.882 | | 605 |
| 12 | −216.754 | 4.000 | Silica | 606 |
| 13 | 127.307 | 44.956 | | 606 |
| 14 | 28.389 | 24.000 | Silica | 607 |
| 15 | 7.676 | 0.683 | | 607 |
| 16 | 12.387 | 3.000 | $CaF_2$ | 608 |
| 17 | −10.095 | 0.475 | | 608 |
| 18 | −8.982 | 5.497 | Silica | 609 |
| 19 | 8.000 | 0.093 | | 609 |
| 20 | 8.069 | 3.000 | $CaF_2$ | 610 |
| 21 | −9.002 | 5.673 | | 610 |
| 22 | Infinity | 0.000 | Mirror | 611 |
| 23 | Infinity | −94.049 | | 611 |
| 24 | 60.160 | −8.000 | Silica | 612 |
| 25 | 158.201 | −20.471 | | 612 |
| 26 | 34.636 | −8.000 | Silica | 613 |
| 27 | 65.450 | 8.000 | Mirror | 613 |
| 28 | 34.636 | 20.471 | | 613 |
| 29 | 158.201 | 8.000 | Silica | 612 |
| 30 | 60.160 | 94.049 | | 612 |
| 31 | Infinity | 0.000 | Mirror | 613 |
| 32 | Infinity | −3.500 | | 613 |
| 33 | Infinity | −2.500 | | 613 |
| 34 | −26.228 | −2.500 | $CaF_2$ | 614 |
| 35 | 12.608 | −0.102 | | 614 |
| 36 | 12.417 | −9.995 | Silica | 615 |
| 37 | −34.270 | −2.110 | | 615 |
| 38 | 70.277 | −2.000 | $CaF_2$ | 616 |
| 39 | 25.599 | −36.553 | | 616 |
| 40 | −139.138 | −7.000 | Silica | 617 |
| 41 | 75.025 | −63.911 | | 617 |
| 42 | −347.832 | −6.000 | Silica | 618 |
| 43 | −60.817 | −6.000 | | 618 |
| 44 | −125.144 | −9.000 | Silica | 619 |
| 45 | 146.610 | −0.500 | | 619 |
| 46 | −69.321 | −9.000 | Silica | 620 |
| 47 | 482.420 | −0.500 | | 620 |
| 48 | −44.275 | −10.217 | Silica | 621 |
| 49 | −474.223 | −0.500 | | 621 |
| 50 | −19.707 | −10.437 | Silica | 622 |
| 51 | −30.002 | −18.250 | | 622 |
| 52 | Infinity | 3.14E-05 | | N/S |
| IMA | Infinity | | | |

It is also possible to use a diffractive optic instead of a second glass material to increase the bandwidth. In this case, the diffractive optic must be manufactured with a specific phase profile to ensure proper diffraction efficiency and angles. Such a design would be possible for those skilled in the art once presented with this disclosure.

The embodiments illustrated in FIGS. 5 and 6 have two disadvantages. First, the optical axis of the Mangin mirror image relay is at 90 degrees to the optical axis defined by the focusing lenses. This arrangement can mandate very high angular and position tolerances for the optical elements in the Mangin mirror image relay. This can result in manufacturing difficulties and increased system cost. For this reason, it is desirable to have a minimum number of lens elements in this 90 degree path. Thus, the 90 degree optical axis can limit the design options for this objective. Second, the pupil plane for aperturing and Fourier filtering is located in a noncollimated region inside the objective. This can produce problems when introducing apertures and filters. Also, because the pupil plane is in a noncollimated region, it is not at the Fourier plane of the object being inspected. This can significantly reduce the effectiveness of Fourier filtering.

The fifth embodiment, illustrated in FIG. 7, solves the problems of the 90 degree bend issue with respect to the Mangin mirror image relay and the internal pupil plane. FIG. 7 illustrates an in-line or straight 0.7 NA catadioptric objective employing a single glass material. The arrangement of FIG. 7 also allows for improved design performance and relaxes manufacturing tolerances. For example, the decentering of any lens element by 5 microns will cause less than one quarter wave of coma without using any compensation elements. Using element decenters and tilts as compensation elements, the tolerances become even more relaxed. The arrangement of FIG. 7 includes one bend with some lenses after the second internal image. These lenses have extremely relaxed tolerances and tend not to affect the manufacturability of the system. The arrangement of FIG. 7 also has an external pupil plane 701 for aperturing and Fourier filtering. This pupil plane is in the collimated region so it corresponds to the Fourier plane of the object. The object in the arrangement of FIG. 7 extends from 0.25 mm to 0.75 mm off axis and the design has a bandwidth of 1 nm from 192.8–193.8 nm. As shown in FIG. 7, light energy or laser energy is transmitted from energy source 7000 (not shown) into objective 700. Objective 700 includes first lens 702 and first field lens 703. This first field lens 703 directs light energy to small folding mirror or reflecting surface 704, which directs energy toward focusing lenses 705 and 706 and to Mangin mirror 707. Light energy reflects back from Mangin mirror 707 back through focusing lenses 706 and 705 and past small folding mirror or reflecting surface 704. Light energy then passes through second field lens 708 and through focusing lens arrangement 720, which includes first focusing lens 709, second focusing lens 710, third focusing lens 711, fourth focusing lens 712, fifth focusing lens 713, sixth focusing lens 714, and seventh focusing lens 715. The specimen or surface 716 to be examined is not shown in FIG. 7, but is located to the right of the objective 700 in the orientation shown in FIG. 7. Light energy strikes the specimen 717 and reflects back through the objective 700 of FIG. 7. Surface data for a system employing the design of FIG. 7 is listed in Table 3.

In a darkfield arrangement, light energy is directed toward the specimen surface as shown in FIG. 2. Light energy may scatter toward the objective, i.e. toward seventh focusing lens 715 in the design of FIG. 7. In such an arrangement, light energy passes back through the system, striking the Mangin mirror 707 and passing through first lens 702.

The design of FIG. 7 provides an optical system with an external pupil plane 701 to support aperturing and Fourier filtering. An aperture can be used in connection with the FIG. 7 design to provide control of the numerical aperture of the imaging system. Such an aperture may optionally be placed at the pupil plane thereby permitting control of overall resolution and depth of focus. Fourier filtering is particularly useful in applications such as laser dark field imaging. Fourier filtering permits filtering surface patterns which repeat by increasing the signal-to-noise ratio for defects on the surface.

TABLE 3

Surface data for linear design shown
in FIG. 7 at 193 nm with a 1 nm bandwidth

| Surf | Radius | Thickness | Material | Element Number |
|---|---|---|---|---|
| OBJ | Infinity | Infinity | | N/S |
| STO | Infinity | 25.000 | | 701 |
| 2 | −222.386 | 4.000 | Silica | 702 |
| 3 | −28.670 | 40.503 | | 702 |
| 4 | 39.160 | 2.500 | Silica | 703 |
| 5 | 177.023 | 10.000 | Silica | 703 |
| 6 | Infinity | 0.000 | Mirror | 704 |
| 7 | Infinity | −98.015 | | 704 |
| 8 | −320.423 | −6.000 | Silica | 705 |
| 9 | 149.893 | −142.852 | | 705 |
| 10 | 58.250 | −8.000 | Silica | 706 |
| 11 | 210.014 | −20.290 | | 706 |
| 12 | 41.193 | −9.000 | Silica | 707 |
| 13 | 81.848 | 9.000 | Mirror | 707 |
| 14 | 41.193 | 20.290 | | 707 |
| 15 | 210.014 | 8.000 | Silica | 706 |
| 16 | 58.250 | 142.852 | | 706 |
| 17 | 149.893 | 6.000 | Silica | 705 |
| 18 | −320.423 | 98.015 | | 705 |
| 19 | Infinity | 44.416 | | 705 |
| 20 | 70.917 | 15.000 | Silica | 708 |
| 21 | 48.487 | 83.467 | | 708 |
| 22 | 326.205 | 11.000 | Silica | 709 |
| 23 | −86.355 | 83.991 | | 709 |
| 24 | 235.491 | 9.000 | Silica | 710 |
| 25 | −111.089 | 10.357 | | 710 |
| 26 | −58.901 | 4.000 | Silica | 711 |
| 27 | −3728.698 | 89.493 | | 711 |
| 28 | 45.959 | 6.365 | Silica | 712 |
| 29 | 41.432 | 9.332 | | 712 |
| 30 | −739.118 | 6.000 | Silica | 713 |
| 31 | −79.014 | 1.000 | | 713 |
| 32 | 44.790 | 9.000 | Silica | 714 |
| 33 | 182.972 | 1.000 | | 714 |
| 34 | 22.072 | 20.822 | Silica | 715 |
| 35 | 36.911 | 11.529 | | 715 |
| IMA | Infinity | | | N/S |

The sixth embodiment presented in FIG. 8 is similar to the fifth embodiment of FIG. 7, but has been optimized for a wavelength of 157 nm. The change in wavelength requires changing the material used from fused silica to calcium fluoride. The index of fused silica at a wavelength of 193 nm is nearly identical to the index for calcium fluoride at 157 nm, so the design requires no major changes aside from the material. However, the dispersion of calcium fluoride at 157 nm is larger than the dispersion of fused silica at 193 nm, which may require some minor changes to further optimize the design. The design presented in FIG. 8 also provides the option of splitting the Mangin mirror into a front surface mirror and a meniscus lens, which can in some cases simplify manufacturing. This split Mangin mirror approach can be employed on the other catadioptric objective designs of FIGS. 3–9 as well. The object extends from 0.25 mm to 0.75 mm off axis and the design has a bandwidth of 0.5 nm from 156.75–157.25 nm.

As shown in FIG. 8, light energy or laser energy is transmitted from energy source 8000 (not shown) and into objective 800. This objective 800 also has an external pupil plane 801 as in the design presented in FIG. 7. Objective 800 includes first lens 802 and first field lens 803. This first field lens 803 directs light energy to small folding mirror or reflecting surface 804, which directs energy toward focusing lenses 805, 806, and 807 and to mirror surface 808. Light energy reflects back from mirror surface 808 back through focusing lenses 807, 806, and 805 and past small folding mirror or reflecting surface 804. Light energy then passes through second field lens group 820 which includes first field lens 809, second fiend lens 810, and third field lens 811. Light then passes through focusing lens arrangement 821, which includes first focusing lens 812, second focusing lens 813, third focusing lens 814, fourth focusing lens 815, fifth focusing lens 816. The specimen or surface 817 to be examined is not shown in FIG. 8, but is located to the right of the objective 800 in the orientation shown in FIG. 8. Light energy strikes the specimen 817 and reflects back through the objective 800 of FIG. 8. Light from specimen 817 can be apertured or Fourier filtered at pupil plane 801 as described in the fifth embodiment and presented in FIG. 7.

The surface data for a system having the objective shown in FIG. 8 is listed in Table 4.

TABLE 4

Surface data for a linear design as shown
in FIG. 8 at 157 nm with a 0.5 nm bandwidth

| Surf | Radius | Thickness | Material | Element Number |
|---|---|---|---|---|
| OBJ | Infinity | Infinity | | N/S |
| STO | Infinity | 25.000 | | 801 |
| 2 | −228.090 | 4.000 | CaF$_2$ | 802 |
| 3 | −26.271 | 34.743 | | 802 |
| 4 | 27.340 | 2.500 | CaF$_2$ | 803 |
| 5 | 78.838 | 10.000 | | 803 |
| 6 | Infinity | 0 | Mirror | 804 |
| 7 | Infinity | −75.368 | | 804 |
| 8 | 332.074 | −6.000 | CaF$_2$ | 805 |
| 9 | 75.615 | −84.484 | | 805 |
| 10 | 53.058 | −7.000 | CaF$_2$ | 806 |
| 11 | 129.105 | −12.000 | | 806 |
| 12 | 40.981 | −7.000 | CaF$_2$ | 807 |
| 13 | 128.091 | −7.480 | | 807 |
| 14 | 69.614 | 7.480 | Mirror | 808 |
| 15 | 128.091 | 7.000 | CaF$_2$ | 807 |
| 16 | 40.981 | 12.000 | | 807 |
| 17 | 129.105 | 7.000 | CaF$_2$ | 806 |
| 18 | 53.058 | 84.484 | | 806 |
| 19 | 75.615 | 6.000 | CaF$_2$ | 805 |
| 20 | 332.074 | 75.368 | | 805 |
| 21 | Infinity | 39.173 | | |
| 22 | 24.018 | 15.000 | CaF$_2$ | 809 |
| 23 | 26.501 | 24.354 | | 809 |
| 24 | −15.238 | 13.419 | CaF$_2$ | 810 |
| 25 | −26.901 | 1.000 | | 810 |
| 26 | 355.973 | 7.000 | CaF$_2$ | 811 |
| 27 | −56.508 | 110.232 | | 811 |
| 28 | 58.858 | 10.000 | CaF$_2$ | 812 |
| 29 | 1338.307 | 6.0469 | | 812 |
| 30 | −54.890 | 10.000 | CaF$_2$ | 813 |
| 31 | −72.556 | 26.319 | | 813 |
| 32 | −308.917 | 6.500 | CaF$_2$ | 814 |
| 33 | −95.467 | 1.000 | | 814 |
| 34 | 34.0794 | 8.000 | CaF$_2$ | 815 |
| 35 | 110.300 | 1.000 | | 815 |
| 36 | 16.407 | 9.697 | CaF$_2$ | 816 |
| 37 | 29.683 | 11.927 | | 816 |
| IMA | Infinity | | | |

Figure 9:
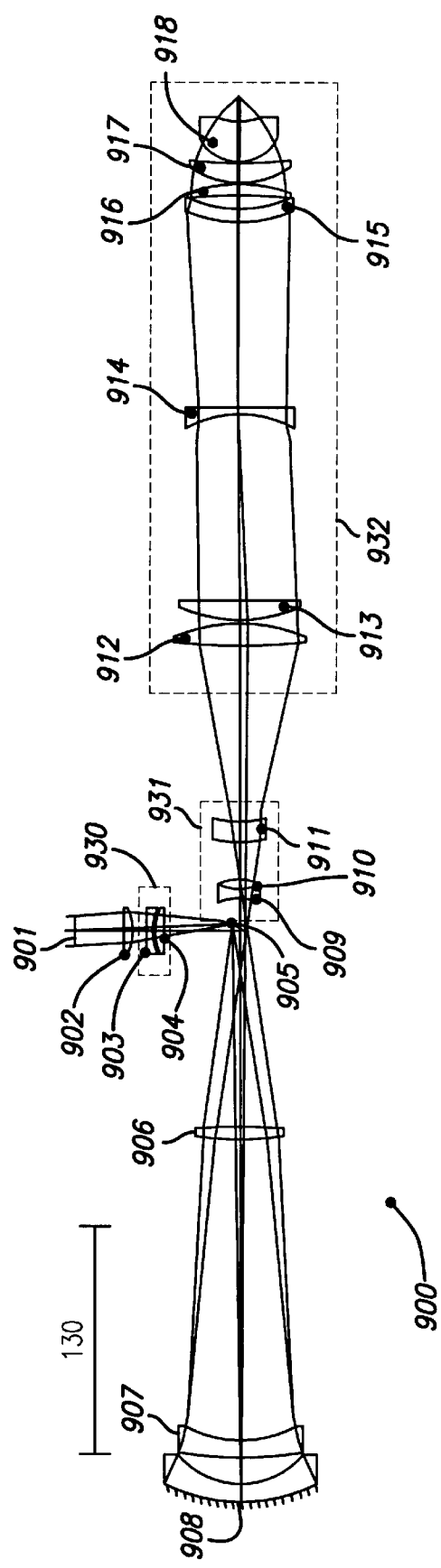
FIG. 9 presents an embodiment of the invention using two glass materials to increase the correction bandwidth from 193 to 203 nm.

The seventh embodiment illustrated in FIG. 9 has similarities to the fifth and sixth embodiments presented in FIGS. 7 and 8. The design presented in FIG. 9 uses the straight through 0.7 NA catadioptric approach to allow more design flexibility, improve performance, and relax the manufacturing tolerances. In addition, similar to the design of FIG. 6, a second glass material, calcium fluoride, is used to increase the correction bandwidth. The design of FIG. 9 is corrected from 193 to 203 nm. The FIG. 9 design has one calcium fluoride element in the eyepiece group and one calcium fluoride/silica doublet near the intermediate image. The object extends from 0.25 mm to 0.75 mm off axis and the design has a bandwidth from 193.3–203.3 nm.

As shown in FIG. 9, light energy or laser energy is transmitted from energy source 9000 (not shown) and into objective 900. As in objective embodiments presented in FIG. 7 and FIG. 8, an external pupil plane 901 is available for aperturing and fourier filtering. Objective 900 includes first lens 902 and first field lens arrangement 930, which includes first field lens 903 and second field lens 904. This first field lens arrangement 930 directs light energy to small folding mirror or reflecting surface 905, which reflects energy toward focusing lenses 906 and 907 and to Mangin mirror 908. Light energy reflects back from Mangin mirror 908 back through focusing lenses 907 and 906, and past small folding mirror or reflecting surface 905. Light energy then passes through second field lens arrangement 931, which includes it third field lens 909, fourth field lens 910, and fifth field lens 911. Light then passes through focusing lens arrangement 932, which includes first focusing lens 912, second focusing lens 9131, third focusing lens 914, fourth focusing lens 915, fifth focusing lens 916, sixth focusing lens 917, seventh focusing lens 918. The specimen or surface 919 to be examined is not shown in FIG. 9, but is located to the right of the objective 900 in the orientation shown in FIG. 9. Light energy strikes the specimen 917 and reflects back through the objective 900 of FIG. 9. The surface data for the design of FIG. 9 is listed in Table 5.

TABLE 5

Surface data for a linear design as in in FIG. 9 at 193 nm with a 10 nm bandwidth

| Surf | Radius | Thickness | Material | Element Number |
|---|---|---|---|---|
| OBJ | Infinity | Infinity | | N/S |
| STO | Infinity | 35.063 | | 901 |
| 2 | 527.763 | 4.000 | Silica | 902 |
| 3 | −32.542 | 8.204 | | 902 |
| 4 | 572.044 | 2.000 | Silica | 903 |
| 5 | 16.118 | 1.447 | | 903 |
| 6 | 17.545 | 5.000 | CaF2 | 904 |
| 7 | −65.290 | 35.838 | | 904 |
| 8 | Infinity | 0.000 | Mirror | 905 |
| 9 | Infinity | −96.873 | | 905 |
| 10 | −795.110 | −10.000 | Silica | 906 |
| 11 | 92.663 | −199.957 | | 906 |
| 12 | 64.758 | −8.000 | Silica | 907 |
| 13 | 281.874 | −14.019 | | 907 |
| 14 | 38.871 | −9.000 | Silica | 908 |
| 15 | 80.841 | 9.000 | Mirror | 908 |
| 16 | 38.871 | 14.019 | | 908 |
| 17 | 281.874 | 8.000 | Silica | 907 |
| 18 | 64.768 | 199.957 | | 907 |
| 19 | 92.663 | 10.000 | Silica | 906 |
| 20 | −795.110 | 96.873 | | 906 |
| 21 | Infinity | 9.399 | | 906 |
| 22 | −16.045 | 2.000 | Silica | 909 |
| 23 | 24.034 | 0.217 | | 909 |
| 24 | 24.751 | 4.000 | CaF2 | 910 |
| 25 | −16.515 | 22.166 | | 910 |
| 26 | 38.990 | 4.000 | Silica | 911 |
| 27 | 41.231 | 164.091 | | 911 |
| 28 | 1232.004 | 10.000 | Silica | 9121 |
| 29 | −95.859 | 1.000 | | 912 |
| 30 | 79.148 | 9.000 | Silica | 913 |
| 31 | −1367.718 | 33.541 | | 913 |
| 32 | −59.580 | 4.000 | Silica | 914 |
| 33 | 201.391 | 45.680 | | 914 |
| 34 | 173.228 | 4.500 | Silica | 915 |
| 35 | 58.668 | 7.500 | | 915 |
| 36 | −127.932 | 6.000 | Silica | 916 |
| 37 | −41.246 | 1.000 | | 916 |
| 38 | 31.082 | 9.000 | Silica | 917 |
| 39 | 153.068 | 1.000 | | 917 |
| 40 | 17.627 | 12.491 | Silica | 918 |

TABLE 5-continued

Surface data for a linear design as in in FIG. 9 at 193 nm with a 10 nm bandwidth

| Surf | Radius | Thickness | Material | Element Number |
|---|---|---|---|---|
| 41 | 35.390 | 11.566 | | 918 |
| IMA | Infinity | | | |

A complete imaging system, such as described in embodiments 1–2 and presented in FIGS. 1–2, requires an objective, such as described in embodiments 3–6 and presented in FIGS. 3–9, and image forming optics. The image forming optics can employ different designs. The image forming optics can be a static tube lens capable of producing a single magnification. In a static tube lens arrangement, different magnifications are achieved by using different tube lenses, which may be readily designed by one skilled in the art. Another image forming optic design is a zooming tube lens. A zooming tube lens requires only a single optical system to produce a wide range of magnifications. Examples of two different types of zooming tube lenses are presented in embodiments 7 and 8 below. Image forming optics must be corrected for the wavelength and spectral bandwidth of the illumination source.

The seventh embodiment illustrated in FIG. 10 is an image forming tube lens employing a varifocal two motion zoom to change magnifications. The design methodology is similar to that presented in the U.S. patent application Ser. No. 08/908,247, entitled "Ultra-Broadband UV Microscope Imaging System with Wide Range Zoom Capability," filed on Aug. 7, 1997, of which this invention is a continuation in part. The design consists of a stationary doublet 1020, a zooming group 1021, and a detector group 1022. The stationary doublet includes a first doublet lens 1002 and a second doublet lens 1003. The zooming group consists of a first zoom lens 1004, a second zoom lens 1005, and a third zoom lens 1006. The detector group 1022 consists of a protective window 1007 and a detector 1008. Different magnifications are achieved by moving the zoom group along the optical axis and then repositioning the detector with the protective window to refocus. Three example magnifications are shown in FIG. 11. The low magnification zoom position 1101 has the shortest total length with the zoom group 1121 farthest away from the doublet 1120. For medium magnification 1102 the total length from the doublet 1120 to the detector group 1122 increases and the distance from the doublet 1120 to the zoom group 1121 decreases. For high magnification 1103 the maximum distance from the doublet 1120 to the detector group 1122 is achieved and the distance from the doublet 1120 to the zoom group 1121 is minimized. This design is capable of magnifications from 38 times to greater than 152 times. Over the magnification range from 38 times to 152 times, the total length of the system from the doublet 1020 to the detector 1008 changes from 320 mm to 880 mm. The three lenses that move in the zooming group 1021 are moved a total of 68 mm. The pupil 1201 of the design in FIG. 12 is matched to the design presented in FIG. 7. One skilled in the art, when presented with this disclosure, could readily design a similar tube lens for use with the objective designs presented in FIGS. 3–9 as well as other designs that are within the scope of this invention. It is also possible for someone skilled in the art, when presented with this disclosure, to design a varifocal two motion zoom with other magnifications and magnification ranges.

The surface data for the design of FIG. 10 is listed in Table 6.

TABLE 6

Surface data for an image forming tube lens as in in FIG. 110 at 193 nm with a 1.5 nm bandwidth

| Surf | Radius | Thickness | Glass | Surface number |
|---|---|---|---|---|
| OBJ | Infinity | Infinity | | N/S |
| STO | Infinity | 20.000 | | 1001 |
| 2 | 121.600 | 3.000 | Caf2 | 1002 |
| 3 | −77.915 | 0.500 | | 1002 |
| 4 | −78.860 | 2.000 | Silica | 1003 |
| 5 | −1820.981 | 90.732 | | 1003 |
| 6 | 106.439 | 2.500 | Caf2 | 1004 |
| 7 | 59.162 | 99.528 | | 1004 |
| 8 | 50.266 | 4.000 | Silica | 1005 |
| 9 | 124.701 | 14.006 | | 1005 |
| 10 | −687.986 | 3.000 | Caf2 | 1006 |
| 11 | 53.069 | 470.445 | | 1006 |
| 12 | Infinity | 1.000 | Silica | 1007 |
| 13 | Infinity | 1.000 | | 1007 |
| IMA | Infinity | | | 1008 |

The eighth embodiment illustrated in FIG. 12 is an image forming tube lens using an optically compensated single motion zoom to change magnifications. The design methodology is similar to that in a paper by David R. Shafer, "Catadioptric optically compensated zooming system with one moving element" Proc SPIE Vol. 2539, pp. 235–240, October 1995. The design consists of a first doublet 1220, a zooming group 1221, a mirror 1206, a second doublet 1222, and a detector 1210. The first doublet consists of a doublet lens 1202 and a following doublet lens 1203. The zooming group consists of a first zoom lens 1204 and a second zoom lens 1205. Different magnifications are achieved by moving the zoom group 1221 along the optical axis of the first doublet 1220, the zoom group 1221, and the mirror 1206. No other motion is required.

Three example magnifications are shown in FIG. 13. The low magnification zoom position 1301 has the zoom group 1321 very close to the first doublet 1320. For the medium magnification 1302, the zoom group is in between the first doublet 1320 and the mirror 1304. For the high magnification 1303 the zoom group 1321 is relatively close to the mirror 1304. The design is capable of magnifications from 60 times to greater than 180 times.

The pupil 1201 of the design in FIG. 12 is matched to the design presented in FIG. 7. The surface data for the design of FIG. 12 is listed in Table 7.

TABLE 7

Surface data for an image forming tube lens as in in FIG. 12 at 193 nm with a 1.5 nm bandwidth

| Surf | Radius | Thickness | Glass | Surface number |
|---|---|---|---|---|
| OBJ | Infinity | Infinity | | N/S |
| STO | Infinity | 20.000 | | 1201 |
| 2 | — | 0.000 | — | N/S |
| 3 | 123.897 | 8.000 | caf2 | 1202 |
| 4 | −213.430 | 33.518 | | 1202 |
| 5 | −119.986 | 4.000 | silica | 1203 |
| 6 | 206.676 | 315.675 | | 1203 |
| 7 | 24267.100 | 4.000 | caf2 | 1204 |
| 8 | 117.959 | 10.577 | | 1204 |
| 9 | 125.844 | 5.000 | silica | 1205 |
| 10 | 325.138 | 319.238 | | 1205 |

TABLE 7-continued

Surface data for an image forming tube lens as in in FIG. 12 at 193 nm with a 1.5 nm bandwidth

| Surf | Radius | Thickness | Glass | Surface number |
|---|---|---|---|---|
| 11 | −1125.668 | −319.238 | MIRROR | 1206 |
| 12 | 325.138 | −5.000 | silica | 1205 |
| 13 | 125.844 | −10.577 | | 1205 |
| 14 | 117.959 | −4.000 | caf2 | 1204 |
| 15 | 24267.100 | −305.678 | | 1204 |
| 16 | — | 0.000 | | N/S |
| 17 | Infinity | 0.000 | MIRROR | 1207 |
| 18 | — | 0.000 | — | N/S |
| 19 | Infinity | 36.000 | | N/S |
| 20 | 39.403 | 6.000 | silica | 1208 |
| 21 | 81.584 | 0.500 | | 1208 |
| 22 | 50.614 | 4.000 | silica | 1209 |
| 23 | 33.375 | 11.140 | | 1209 |
| IMA | Infinity | | | 1210 |

While the invention has been described in connection with specific embodiments thereof, it will be understood that the invention is capable of further modifications. This application is intended to cover any variations, uses or adaptations of the invention following, in general, the principles of the invention, and including such departures from the present disclosure as come within known and customary practice within the art to which the invention pertains.

What is claimed is:

1. A combined catadioptric lensing and mirror optical inspection system for inspecting a specimen, comprising:

a primary focusing lens arrangement;

a primary field lens arrangement;

a fold mirror;

a Mangin mirror arrangement;

a secondary field lens arrangement; and a secondary focusing lens arrangement;

wherein said system is able to receive transmitted light energy and pass light energy to said primary focusing lens arrangement, said primary field lens arrangement, said fold mirror, said Mangin mirror arrangement, said secondary field lens arrangement, and secondary focusing lens arrangement, and to said specimen;

and further wherein said combined catadioptric lensing and mirror optical inspection system has off-axis orientation whereby output rays provided by said Mangin mirror arrangement are physically displaced from output rays transmitted toward said Mangin mirror arrangement.

and still further wherein light energy striking said specimen passes back to said secondary focusing lens arrangement, said secondary field lens arrangement, said Mangin mirror arrangement, said fold mirror, said primary field lens arrangement, and said primary focusing lens arrangement.

2. The system of claim 1, wherein said system has an accessible pupil plane and further comprising at least one from the group of:

a Fourier filter proximate said accessible pupil plane; and an aperture proximate said accessible pupil plane.

3. The system of claim 1, further comprising:

an illumination source for producing said light energy; and a detector.

4. A catadioptric imaging system for inspecting a specimen comprising:
   an unobscured catadioptric objective comprising a Mangin mirror; and
   image forming optics;
   wherein the catadioptric objective of said system is corrected to operate over a bandwidth greater than or equal to approximately 0.3 nm;
   further wherein said system transmits said energy to said unobscured catadioptric objective and Mangin mirror, to said image forming optics, to said specimen, and back through the image forming optics, Mangin mirror, and unobscured catadioptric objective.

5. The system of claim 4 wherein the system is corrected over a bandwidth of greater than or equal to approximately 10 nm.

6. The system of claim 4, wherein said system has an accessible pupil plane and further comprising at least one from the group of:
   a Fourier filter; and
   an aperture.

7. The system of claim 4, further comprising:
   an illumination source for producing said light energy;
   image forming optics; and
   a detector.

8. An unobscured catadioptric objective comprising:
   a primary focusing lens arrangement;
   a primary field lens arrangement;
   a Mangin lens/mirror element;
   a reflecting surface;
   a secondary field lens arrangement; and
   a secondary focusing lens arrangement;
   wherein said objective is oriented to receive light energy and pass light energy to said primary focusing lens arrangement, to said reflecting surface, to said primary field lens arrangement, to said Mangin lens/mirror element, back to said primary focusing lens arrangement, to said secondary field lens arrangement, and to said secondary focusing lens arrangement;
   and further wherein light energy directed to said unobscured catadioptric objective contacts a specimen and light energy reflected from said specimen passes back through said unobscured catadioptric objective.

9. The objective of claim 8, wherein said objective has an accessible pupil plane and further comprising at least one from the group of:
   a Fourier filter; and
   an aperture.

10. The objective of claim 8, further comprising:
    image forming optics; and
    a detector.

11. An unobscured catadioptric objective comprising:
    a primary focusing lens arrangement;
    a primary field lens arrangement;
    a Mangin lens/mirror element;
    a reflecting surface;
    a secondary field lens arrangement; and
    a secondary focusing lens arrangement;
    wherein said objective is oriented to receive light energy and pass light energy to said primary focusing lens arrangement, to said reflecting surface, to said primary field lens arrangement, to said Mangin lens/mirror element, back to said primary focusing lens arrangement, to said secondary field lens arrangment, and to said secondary focusing lens arrangement;
    and further wherein light energy reflected from said specimen passes back through said unobscured objective.

12. The objective of claim 1, wherein said objective has an accessible pupil plane and further comprising at least one from the group of:
    a Fourier filter; and
    an aperture.

13. The objective of claim 1, further comprising:
    image forming optics; and
    a detector.

* * * * *